(12) United States Patent
Ma et al.

(10) Patent No.: US 10,347,790 B2
(45) Date of Patent: Jul. 9, 2019

(54) GROUP III-V NITRIDE-BASED LIGHT EMITTING DEVICES HAVING MULTILAYERED P-TYPE CONTACTS

(71) Applicant: Wisconsin Alumni Research Foundation, Madison, WI (US)

(72) Inventors: Zhenqiang Ma, Middleton, WI (US); Dong Liu, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 15/928,774

(22) Filed: Mar. 22, 2018

(65) Prior Publication Data

US 2018/0277715 A1    Sep. 27, 2018

Related U.S. Application Data

(60) Provisional application No. 62/476,070, filed on Mar. 24, 2017.

(51) Int. Cl.
| | | |
|---|---|---|
| H01L 29/06 | (2006.01) | |
| H01L 31/0328 | (2006.01) | |
| H01L 33/06 | (2010.01) | |
| H01L 33/00 | (2010.01) | |
| H01L 33/34 | (2010.01) | |
| H01L 33/32 | (2010.01) | |

(52) U.S. Cl.
CPC .......... *H01L 33/06* (2013.01); *H01L 33/0025* (2013.01); *H01L 33/32* (2013.01); *H01L 33/34* (2013.01)

(58) Field of Classification Search
CPC . H01L 31/03048; H01L 33/002; H01L 33/06; H01L 33/0025; H01L 33/0062; H01L 33/007; H01L 33/0075; H01L 33/26; H01L 33/30; H01L 29/2003; H01S 5/34
See application file for complete search history.

(56) References Cited

U.S. PATENT DOCUMENTS

| | | |
|---|---|---|
| 4,590,501 A | 5/1986 | Scholl |
| 6,881,988 B2 | 4/2005 | Niwa et al. |

(Continued)

FOREIGN PATENT DOCUMENTS

| | | |
|---|---|---|
| GB | 2453464 | 4/2009 |
| JP | 2005-512327 | 4/2005 |

(Continued)

OTHER PUBLICATIONS

International Search Report and Written Opinion mailed in PCT/US2018/023811, dated Aug. 10, 2018.

(Continued)

*Primary Examiner* — Hsien Ming Lee
(74) *Attorney, Agent, or Firm* — Bell & Manninng, LLC; Michelle Manning

(57) ABSTRACT

Light-emitting devices having a multiple quantum well (MQW) pin diode structure are provided. The light-emitting devices include a multilayered p-type contact composed of a heavily p-type doped hole injection layer and a thin p-type group III-nitride layer. The materials of the hole injection layer and the p-type group III-nitride layer are separated by a layer of a material that allows current tunneling through the heterogeneous junction formed between the lattice mismatched materials.

22 Claims, 28 Drawing Sheets

(56) References Cited

U.S. PATENT DOCUMENTS

| | | | |
|---|---|---|---|
| 7,030,428 | B2 | 4/2006 | Saxler |
| 7,354,809 | B2 | 4/2008 | Yuan et al. |
| 7,777,290 | B2 | 8/2010 | Lagally et al. |
| 8,217,410 | B2 | 7/2012 | Ma et al. |
| 8,227,789 | B2 | 7/2012 | Hirayama et al. |
| 8,232,617 | B2 | 7/2012 | Ma et al. |
| 8,865,489 | B2 | 10/2014 | Rogers et al. |
| 9,425,351 | B2 * | 8/2016 | Ma .................. H01L 33/06 |
| 2003/0032253 | A1 | 2/2003 | Nguyen et al. |
| 2004/0164319 | A1 | 8/2004 | Zampardi et al. |
| 2005/0218428 | A1 | 10/2005 | Bahl et al. |
| 2006/0086932 | A1 | 4/2006 | Kim et al. |
| 2006/0121682 | A1 | 6/2006 | Saxler |
| 2006/0180830 | A1 | 8/2006 | Alavi et al. |
| 2011/0027921 | A1 | 2/2011 | Hamasaki et al. |
| 2013/0065341 | A1 | 3/2013 | Kai et al. |
| 2013/0214303 | A1 | 8/2013 | Kinoshita et al. |
| 2013/0234168 | A1 | 9/2013 | Kinoshita et al. |
| 2013/0277642 | A1 | 10/2013 | Kneissl et al. |
| 2014/0264375 | A1 | 9/2014 | Ma et al. |
| 2015/0255670 | A1 | 9/2015 | Furuyama et al. |
| 2016/0204306 | A1 | 7/2016 | Ma et al. |
| 2017/0077339 | A1 | 3/2017 | Ma et al. |

FOREIGN PATENT DOCUMENTS

| | | |
|---|---|---|
| JP | 2007-103689 | 4/2007 |
| JP | 4959693 | 6/2012 |
| KR | 10-2003-0063075 | 7/2003 |
| KR | 10-2005-0081207 | 8/2005 |
| KR | 10-2006-0036713 | 5/2006 |
| KR | 10-2007-0063912 | 6/2007 |
| WO | WO 2016/160720 | 10/2016 |

OTHER PUBLICATIONS

Dong, L. et al., 229 nm UV LEDs using p-type silicon for increased hole injection, Aug. 13, 2017.

Gui et al., The effect of surface roughness on direct wafer bonding, Journal of Applied Physics, vol. 85, No. 10, May 15, 1999, pp. 7448-7454.

Chen et al., Epitaxially oriented growth of diamond on silicon by hot filament chemical vapor deposition, Appl. Phys. Lett., vol. 68, No. 2, Jan. 8, 1996, pp. 176-178.

Barnett et al., 50% Efficient Solar Cell Architectures and Designs, Conference Record of the 2006 IEEE 4th World Conference on Photovoltaic Energy Conversion, Waikoloa, HI, May 7-12, 2006, pp. 2560-2564.

International Search Report and Written Opinion issued in PCT/US2014/011569, dated May 20, 2014.

Liu et al. "226 nm AlGaN/AlN UV LEDS using p-type Si for hole injection and UV reflection," Applied Physics Letters, 2018, pp. 011111-1 to 011111-5.

Liu et al., "229 nm UV LEDs using p-type silicon for increased hole injection," 2018, 12 pages.

Islam et al., "MBE-grown 232-270 nm deep-UV LEDs using monolayer thin binary GaN/AlN quantum heterostructures," Appl. Phys. Lett, vol. 110, pp. 041108-1 to 041108-5.

Cho et al., "UVC LEDs on Bulk AlN Substrates Using Silicon Nanomembranes for Efficient Hole Injection," ResearchGate, preprint date Jul. 2017, 26 pages.

Zhang et al.,"Design of p-type cladding layers for tunnel-injected UV-A light emitting diodes," Applied Physics Letters, vol. 109, 2016, pp. 191105-1 to 191105-5.

Zhang et al., "Interband tunneling for hole injection in III-nitride ultraviolet emitters," Applied Physics Letters, vol. 106, 2015, pp. 141103-1 to 141103-5.

Krishnamoorthy et al., "Polarization-engineered GaN/InGaN/GaN tunnel diodes," Applied Physics Letters, vol. 97, 2010, pp. 203502-1 to 203502-3.

* cited by examiner

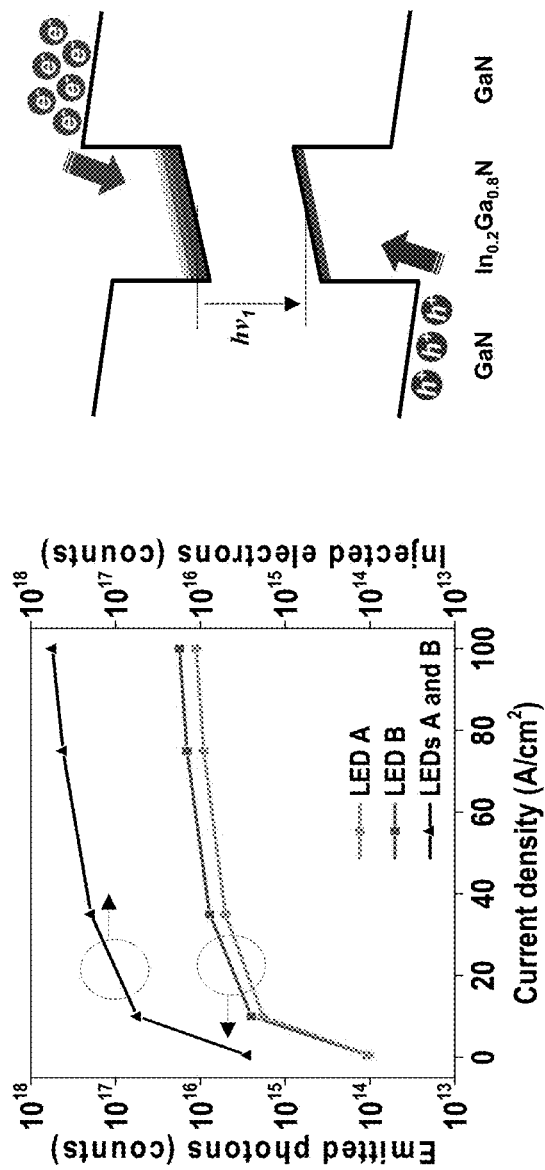
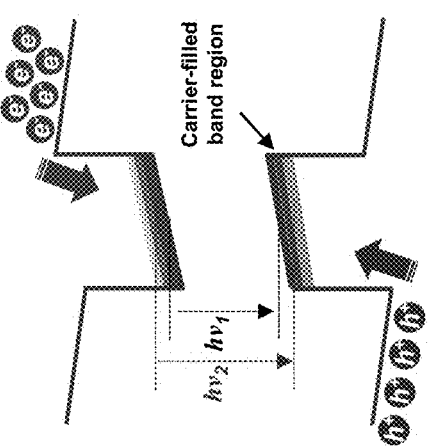
FIG. 11A
FIG. 11B
FIG. 11C

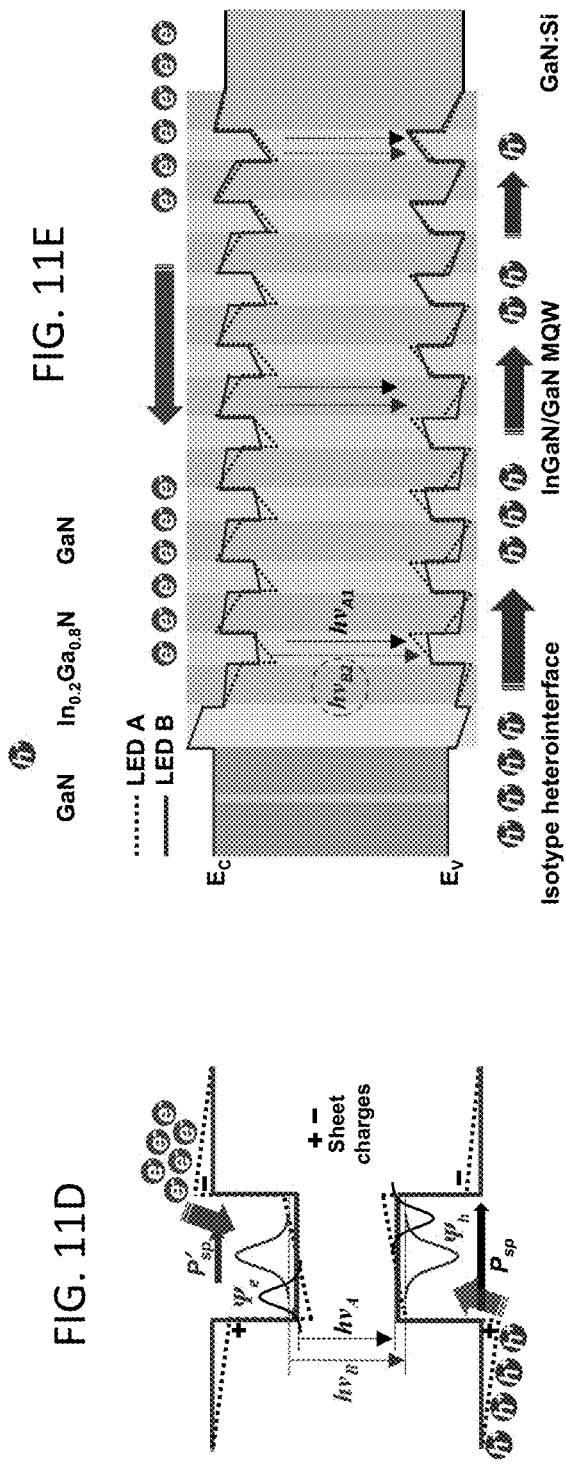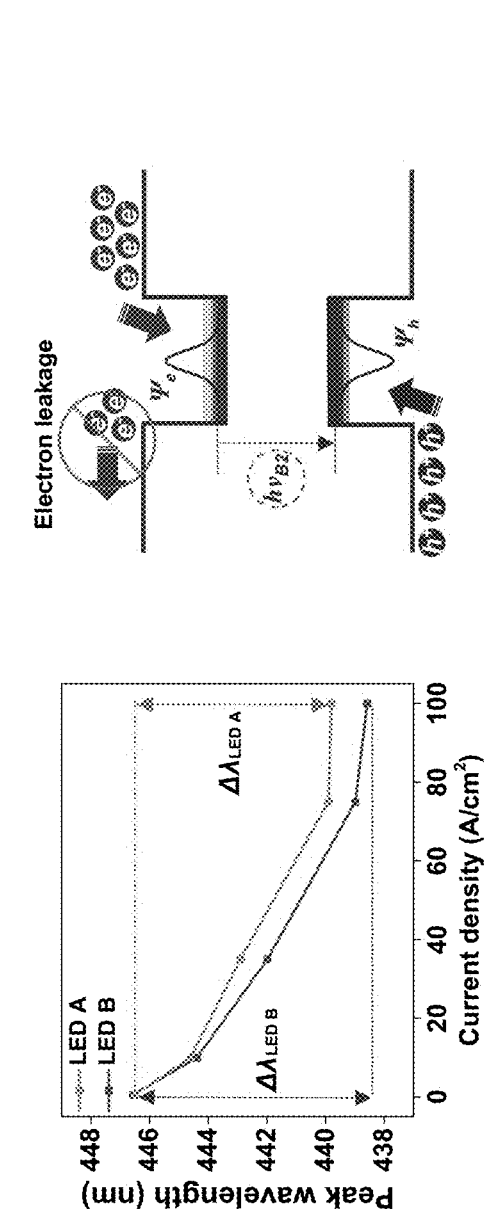
FIG. 11E
FIG. 11G
FIG. 11F
FIG. 11D

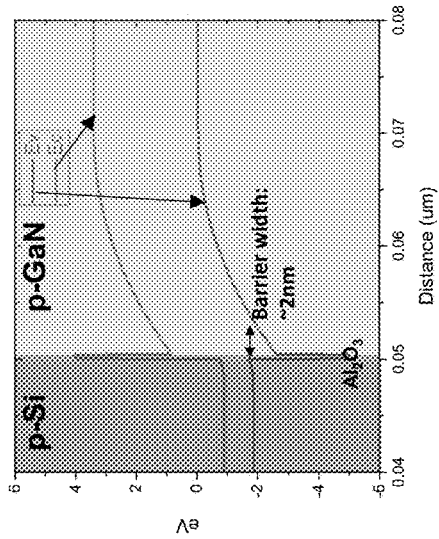
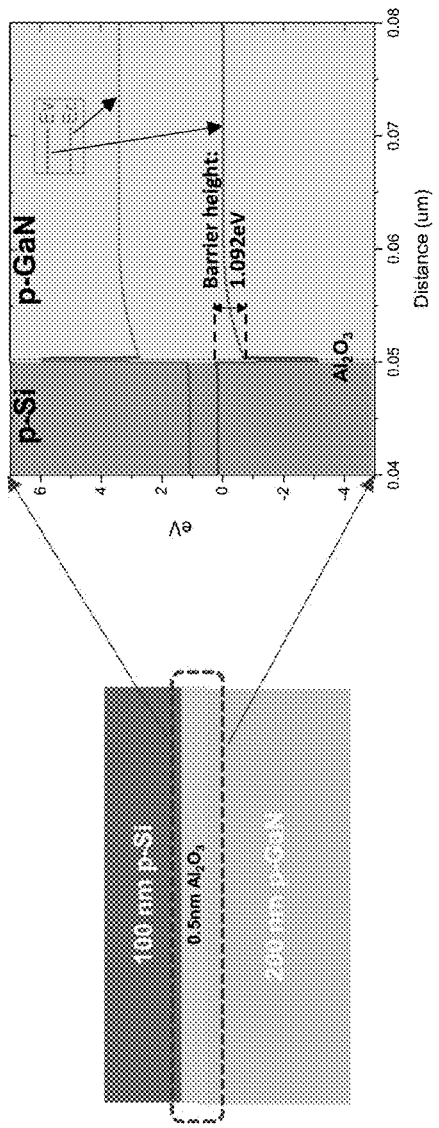
FIG. 17C
FIG. 17B
FIG. 17A

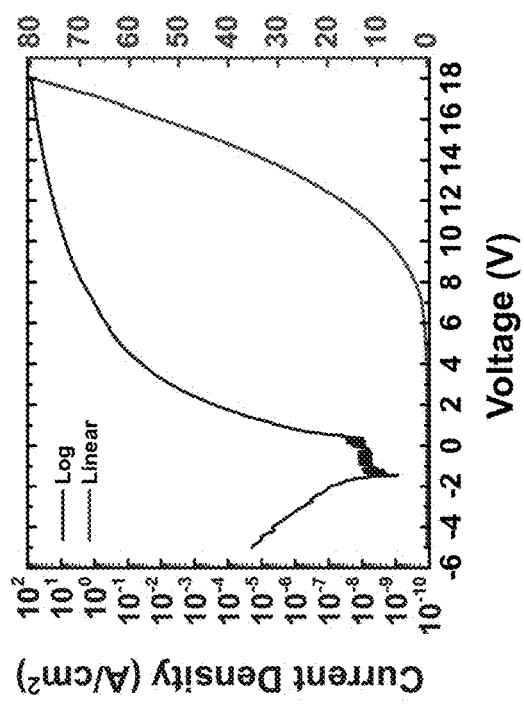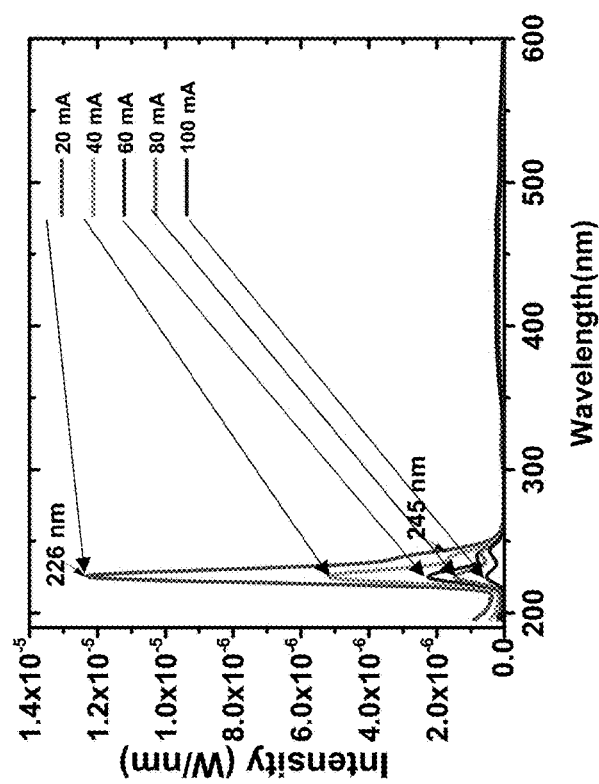
FIG. 19A
FIG. 19B

GROUP III-V NITRIDE-BASED LIGHT EMITTING DEVICES HAVING MULTILAYERED P-TYPE CONTACTS

CROSS-REFERENCE TO RELATED APPLICATIONS

The present application claims priority to U.S. provisional patent application No. 62/476,070 that was filed Mar. 24, 2017, the entire contents of which are incorporated herein by reference.

REFERENCE TO GOVERNMENT RIGHTS

This invention was made with government support under HR0011-15-2-0002 awarded by DOD/DARPA. The government has certain rights in the invention.

BACKGROUND

Semiconductor deep-ultraviolet (DUV) light-emitting diodes (LEDs) operating at sub-250 nm wavelengths have attracted interest due to their applications in such areas as sterilization, biosensing, medical treatment, and lithography. Aluminum gallium nitride (AlGaN) is a widely used material for commercial UV LEDs because of its direct bandgap spanning the UVA, UVB, and UVC regions of the electromagnetic spectrum. However, at sub-250 nm wavelengths, challenges arise, among which the key issues include. 1) degrading crystal quality of the high-Al-content AlGaN materials, as defects related to non-radiative recombination can severely degrade internal quantum efficiency (IQE); 2) low conductivity and poor carrier injection of the AlGaN, especially for p-type AlGaN, due to the large ionization energy of donors (280 meV for AlN:Si), and the even larger ionization energy of acceptors (630 meV for AlN:Mg); and 3) compromised light extraction, especially at DUV wavelengths, due to absorption by the p-GaN contact layer, which is commonly adopted to form a highly conductive ohmic contact.

Planar DUV LEDs are commonly grown on highly lattice-mismatched substrates, resulting in a high concentration of threading dislocations (TDs), which act as non-radiative recombination centers that contribute to low internal quantum efficiencies. Monolayer gallium nitride (GaN) quantum wells and dots between AlN barriers have been demonstrated to improve IQE, as carriers are kept away from non-radioactive recombination centers due to three-dimensional confinement. (See, Kandaswamy. et al. Tunnel-injection GaN quantum dot ultraviolet light-emitting diodes. *Appl Phys Lett* 102, 041103 (2013); Taniyasu Y., et al., Polarization property of deep-ultraviolet light emission from C-plane AlN/GaN short-period superlattices. *Appl Phys Lett* 99, 251112 (2011); Verma et al. Tunnel-injection quantum dot deep-ultraviolet light-emitting diodes with polarization-induced doping in III-nitride heterostructures. *Appl Phys Lett* 104, 021105 (2014); and Islam et al. MBE-grown 232-270 nm deep-UV LEDs using monolayer thin binary GaN/AlN quantum heterostructures. *Appl Phys Lett* 110, 041108 (2017).) Light emission at 232 nm by 1-2 monolayer (ML) GaN quantum structures has been reported. This is probably the shortest wavelength this GaN/AlN quantum heterostructure could achieve, considering the theoretical limit and single monolayer GaN growth precision. In addition, the light emission efficiency suffers from the absorption and re-emission of n- and p-AlGaN (Al: 0.5 to 1) regions with lower bandgap energy (4.6 for $Al_{0.5}Ga_{0.5}N$) than the 232 nm photon.

To improve free carrier concentration in high-Al-content AlGaN materials, researchers have developed polarization doping, the purpose of which is to enhance electrical conductivity and hole injection. (See. Islam et al. MBE-grown 232-270 nm deep-UV LEDs using monolayer thin binary GaN/AlN quantum heterostructures. *Appl Phys Lett* 110, 041108 (2017); Simon, et al. Polarization-induced hole doping in wide-band-gap uniaxial semiconductor heterostructures. *Science* 327, 60-64 (2010); and Ambacher, et al. Two-dimensional electron gases induced by spontaneous and piezoelectric polarization in undoped and doped AlGaN/GaN heterostructures. *J Appl Phys* 87, 334-344 (2000).) Doping by varying the Al composition and the corresponding polarization strength has been employed to take advantage of the intrinsic spontaneous polarization effect to increase carrier concentration. (See. Jena. et al. Realization of wide electron slabs by polarization bulk doping in graded III-V nitride semiconductor alloys. *Appl Phys Lett* 81, 4395-4397 (2002); Li. et al. Polarization induced hole doping in graded $Al_xGa_{1-x}N$ (x=0.7~1) layer grown by molecular beam epitaxy. *Appl Phys Lett* 102, 062108 (2013); Neufeld. et al. Effect of doping and polarization on carrier collection in InGaN quantum well solar cells. *Appl Phys Lett* 98, 243507 (2011); Sanchez-Rojas, et al. Tailoring of internal fields in AlGaN/GaN and InGaN/GaN heterostructure devices. *Phys Rev B* 61, 2773-2778 (2000); and Kozodoy, et al. Polarization-enhanced Mg doping of AlGaN/GaN superlattices. *Appl Phys Lett* 75, 2444-2446 (1999).) For the [000-1] crystallographic orientation (N-face), the Al mole fraction, x, in the $Al_xGa_{1-x}N$ needs to be graded up towards the p and n contacts, in which case the x grading range required for effective doping is limited. Ultimately, this method is not applicable when the Al composition in the active quantum barriers approaches 1, which is necessary in order to generate high energy photons (e.g., ~5 eV for 250 nm). The Ga-face ([0001]) requires the Al composition to grade down towards the contacts, which, if graded down to the point that the band gap energy is smaller than that of the emitted photon, will act as a highly absorptive layer due to smaller band gap energy.

SUMMARY

Light-emitting devices, including devices configured to emit light in the ultraviolet, the deep ultraviolet, and/or the blue regions of the electromagnetic spectrum are provided.

One embodiment of a light-emitting device includes: a p-type contact that includes: (i) a hole injection layer comprising a p-type doped semiconductor material; (ii) a p-type layer comprising p-type doped GaN (p-GaN); and (iii) a current tunneling layer disposed between the hole injection layer and the p-type layer. The current tunneling layer includes an inorganic material having a bandgap that is wider than the bandgaps of the p-type doped hole injecting semiconductor material and the p-type doped GaN. The interface between the current tunneling layer and the hole injection layer and the interface between the current tunneling layer and the p-type layer do not have an epitaxial structure. The light-emitting device further includes an n-type contact and an active region comprising intrinsic semiconductor materials disposed between the p-type contact and the n-type contact. The active region comprises a multiple quantum well (MQW) structure of alternating group III-V nitride barrier layers and group III-V nitride quantum well layers.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 5A depicts the band alignment under thermal equilibrium. FIG. 5B depicts the band alignment under forward bias (240 A/cm$^2$). FIG. 5C shows hole concentration comparisons for the LED structure with the proposed Si as hole injection layer and without. FIG. 5D shows electron and hole concentration distributions within the QWs region under forward bias.

FIG. 6A shows current density-voltage characteristics of the fabricated UV LED. FIG. 6B shows EL spectra (linear scale) taken at drive currents ranging from 20 mA to 320 mA. FIG. 6C shows light output power and the corresponding voltage applied to the LED versus current density. The dotted line was drawn to show the linear trend of the light output power.

FIGS. 11A-11G show phenomena in the MQW with increased carrier injection. FIG. 11A shows the number of emitted photons and injected electrons of the LEDs A and B as a function of current density. FIG. 11B shows a single QW of LED A with the photon energy of hv$_1$. h is the Planck's constant and v is the frequency of light. FIG. 11C shows a single QW of LED B with the improved radiative recombination in the broadened region due to the band-filling effect of increased carrier injection. LED B emits photons with energy ranging from hv$_1$ to hv$_2$ (v$_1$<v$_2$). FIG. 11D shows a screening of internal polarization field (P$_{SP}$) in the QW by the increased carrier injection (i.e., suppression of quantum-confined Stark effect (QCSE)). The dotted and solid lines indicate the energy bands of QW for LEDs A and B, respectively. FIG. 11E shows the energy band diagrams of LED A and LED B that are plotted together. Improvement in hole injection is more effective near the GaN:Mg region than the region that is far away from the GaN:Mag region, leading to the increase in photon generation. FIG. 11F shows EL peak wavelength shifts of the LEDs A (Δλ$_{LED\_A}$) and B (Δλ$_{LED\_B}$), associated with the band-filling and internal polarization screening effects in the MQW from the increased hole injection. FIG. 11G shows an ideal band diagram of a single QW of LED B with the photon energy of hv$_{B2}$, formed by the band-filling and internal polarization screening effects by the increased hole injection.

FIG. 12A depicts normalized wall-plug efficiency (WPE). FIG. 12B depicts normalized efficacy. FIG. 12C depicts the WPE droop rate. FIG. 12D depicts efficacy. FIG. 12E depicts the external-quantum efficiency (EQE) droop rate.

FIGS. 17A-17E depict a p-Si/Al$_2$O$_3$/p-GaN tunneling junction for hole transport. FIG. 17A is a cross-sectional illustration of the p-Si/Al$_2$O$_3$/p-GaN isotype heterojunction test structure. The deposited thickness of Al$_2$O$_3$ by ALD is 0.5 nm. The p-GaN thickness for this testing structure is 200 nm. FIG. 17B shows a simulated band alignment of the p-Si/Al$_2$O$_3$/p-GaN under thermal equilibrium. FIG. 17C shows a simulated band alignment of the p-Si/Al$_2$O$_3$/p-GaN under positive bias of 2V applied on Si. FIG. 17D depicts simulated current density and tunneling rate distribution across the p-Si/Al$_2$O$_3$/p-GaN heterojunction. FIG. 17E depicts simulated and measured electrical I-V characteristics.

FIG. 19A shows current density-voltage characteristics of a typical LED in linear and log scale. FIG. 19B shows EL spectra under 20 mA, 40 mA, 60 mA and 100 mA driving currents with CW operation.

DETAILED DESCRIPTION

Figure 1:
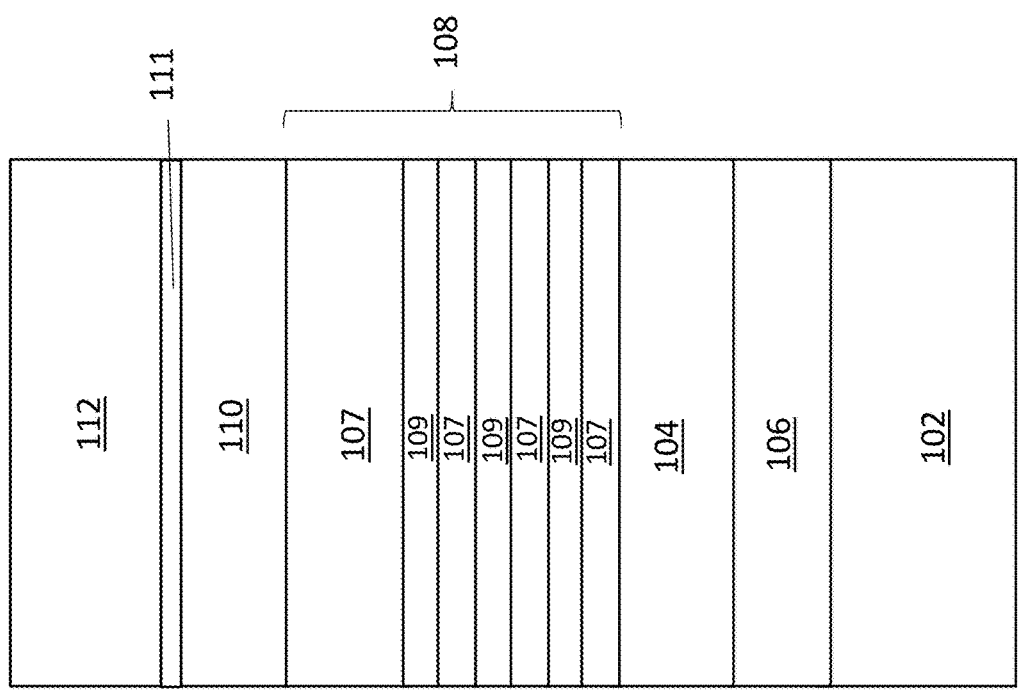
FIG. 1 depicts a UV LED epitaxial structure and p-Si/Al$_2$O$_3$/p-GaN heterojunction structure.

Light-emitting devices having a multiple quantum well (MQW) pin diode structure and methods of making and using the devices are provided. The light-emitting devices comprise a multilayered p-type contact; an n-type contact; and a light-emitting active region disposed between the p-type contact and the n-type contact.

The p-type contact of the light emitting device is composed of a heavily p-type doped hole injection layer and a p-type GaN (p-GaN) layer. The materials of the hole injection layer and the p-type GaN layer are lattice mismatched and separated by a layer of a material that allows current tunneling through the heterogeneous junction formed between the lattice mismatched materials. The p-type contact can be fabricated using a thin film transfer and bonding process that allows the material of the hole injection layer to be selected independently from the GaN material of the p-type layer and also from the intrinsic semiconductor materials of the device's active region. The current tunneling layer is formed of an inorganic material having a bandgap that is wider that the bandgaps of the hole injection layer material and the p-type GaN of the contact layer.

Placing a layer of p-GaN between the heavily p-type doped hole injection layer and the active region of the device can be advantageous because the p-GaN layer can improve hole injection in embodiments where the valence band offset between the material of the hole injection layer (for example, silicon) and the p-GaN is smaller than that between the material of the hole injection layer and the nitride semiconductor of the active region (for example, AlGaN or AlN). In addition, because some nitride semiconductors, such as high Al-content AlGaN readily oxidize, the p-GaN can be used to avoid or minimize undesired oxidation of the exposed surface of the active region during device fabrication.

As used herein, the term "current tunneling layer" refers to a layer characterized in that it is made from an appropriate material and is sufficiently thin that it is able to act as a tunneling layer for electrons and/or holes. That is, unlike a typical dielectric medium, it allows both electrons and holes to pass through it, from a first layer to a second layer of semiconductor material, via quantum tunneling. Thus, because metals would block the passage of holes, metals are not suitable materials for a current tunneling layer. However, a wide range of non-metal inorganic materials can meet these criteria. The inorganic material of the current tunneling layer may be a material that would act as a dielectric in its bulk form, but is sufficiently thin that it no longer acts as an electrical insulator. The current tunneling layer provides a sort of 'glue' between the layers of the p-type contact. In addition, the current tunneling layer can prevent the interdiffusion of the semiconductor materials from the neighboring layers of p-type contact. This avoids the formation of an unwanted, intervening, cross-contaminated semiconductor interface layer.

Other advantages provided by this layer of inorganic material are that it can passivate the surfaces of the layers of semiconductor materials with which it is in contact, such that dangling bonds and interface states are minimized or eliminated. This property is useful because, when directly bonding two non-lattice matched single-crystalline materials, the chemical bonds formed between the two materials can create a large number of interface states. These interface states prevent the two materials from forming ideal rectifying junctions. However, when the inorganic material is inserted, the two materials are physically separated. If the layer is sufficiently thin and has the capability to chemically passivate the materials, the number of interface states can be reduced to levels such that both electrons and holes can efficiently tunnel through the layer.

The intrinsic active region includes a MQW structure comprising alternating barrier and quantum well layers, both of which are comprised of group III-V nitride semiconductors. In the MQW structures, charge carriers are confined via quantum confinement in thin layers of the "well" material sandwiched between layers of the "barrier" material. The active region may further comprise a lower spacer layer and an upper spacer layer between which the MQW structure is disposed. The spacer layers are used to increase the thickness of the intrinsic active region and are comprised of undoped single-crystalline semiconductor materials. For active regions designed to emit in the ultraviolet and the deep ultraviolet, the well layers can comprise a high aluminum content AlGaN. For example, Al$_x$Ga$_{1-x}$N, where x is at least 0.5 or at least 0.8 can be used.

Other components that may be part of the light-emitting devices are those commonly incorporated into such devices, including a substrate, buffer layers, cladding layers, reflectors, electrodes, and electrical interconnects. For example, the devices may further comprise electrodes in electrical communication with the p-type contact and n-type contact and a voltage source configured to apply a voltage across the active region of the device.

LEDs are examples of light-emitting devices that can include the MQW pin diode structures. A schematic diagram showing a cross-sectional view of one embodiment of an LED is provided in FIG. 1. The LED includes a substrate 102 and an n-type contact comprising an electron injection layer 104 comprising an n-type doped semiconductor material. In this embodiment, substrate 102 is a growth substrate upon which the electron injection layer 104 is epitaxially grown and, therefore, the structure further includes a buffer layer 106 to facilitate the epitaxial growth of the semiconductor material of the electron injection layer over the substrate material. Active region 108 comprising a MQW structure that includes alternating barrier layers 107 and well layers 109 is disposed on electron injection layer 104. A p-type contact of the device is disposed on MQW structure 108 and includes a current tunneling layer 111 disposed between a p-type layer 110 and a hole injection layer 112. Though not shown in this figure, the LED may further include a current spreading layer on the hole injection layer. By way of illustration only, substrate 102 may be an AlN substrate, buffer layer 106 may be a layer of homoepitaxial AlN, electron injection layer 104 may be n-doped AlGaN (n-AlGaN; e.g., $Al_{0.82}Ga_{0.18}N$:Si), MQW structure 108 may include alternating AlN barrier layers and AlGaN (e.g., $Al_{0.8}Ga_{0.2}N$) quantum well layers, p-type layer 110 may be a p-type GaN layer, current tunneling layer 111 may be a layer of $Al_2O_3$, and hole injection layer 112 may be a thin layer of single-crystalline Si (also referred to as a silicon nanomembrane or a Si NM) or a layer of polycrystalline Si.

Figure 7:
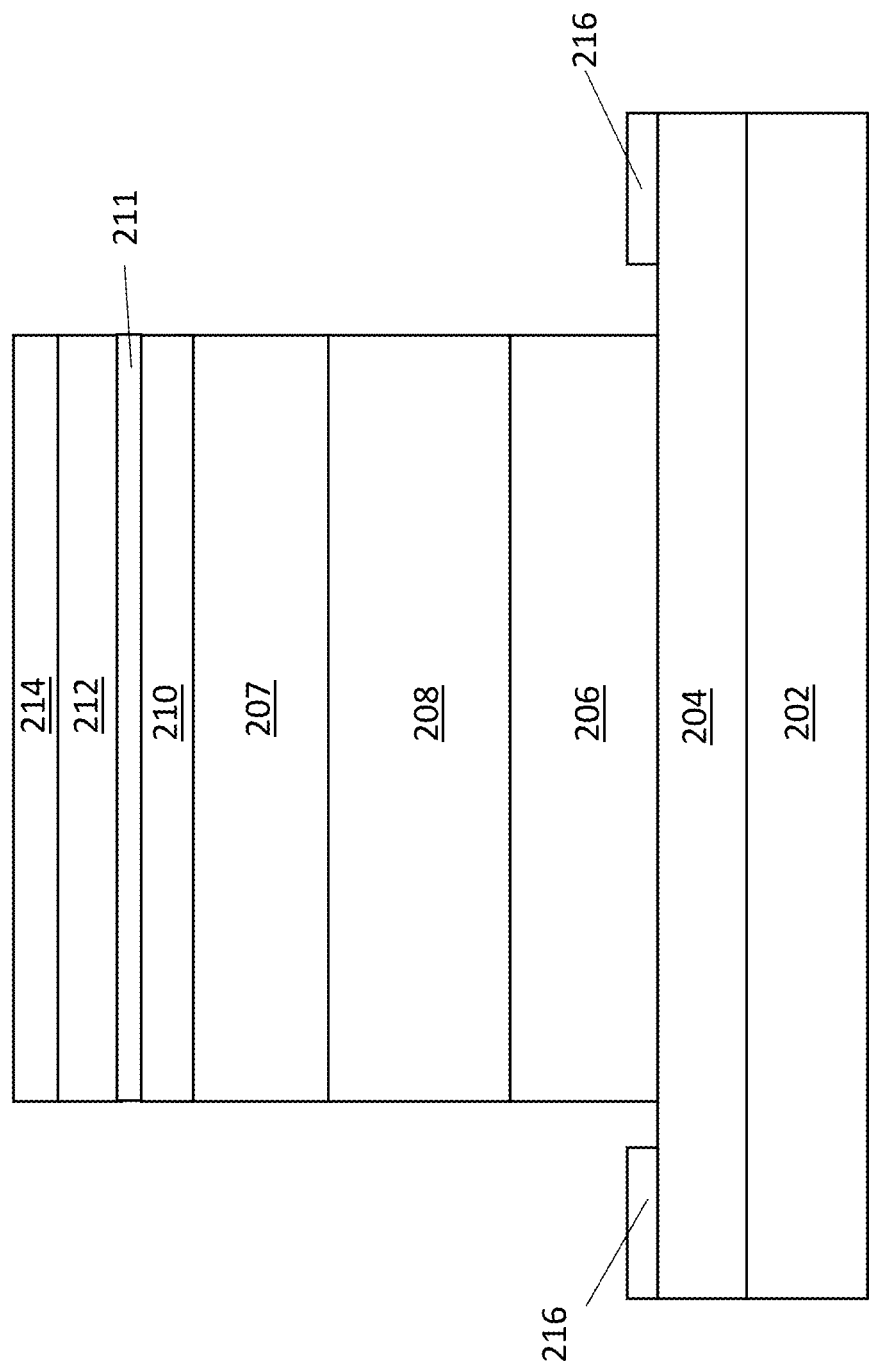
FIG. 7 is a schematic cross-sectional view of an edge-emitting laser that includes a p-Si/current tunneling layer/p-GaN layer.

Lasers are also examples of light-emitting devices that can include the MQW pin diode structures. For example, the MQW pin diode structures can also be incorporated into an edge-emitting laser, as shown schematically in FIG. 7. The edge-emitting laser includes a substrate 202 and an n-type contact comprising an electron injection layer 204 composed of an n-type doped semiconductor material. A lower cladding 206 is disposed on electron injection layer 204. An active region 208 comprising a MQW structure is disposed on lower cladding 206 and upper cladding 207 is disposed over active region 208. A p-type contact of the device is disposed on upper cladding 207 and includes a current tunneling layer 211 disposed between a p-type layer 210 and a hole injection layer 212. An anode 214 and a cathode 216 are placed in electrical communication with the hole and electron injection layers, respectively. By way of illustration only, substrate 202 may be an AlN substrate, electron injection layer 204 may be n-doped AlGaN (e.g., $Al_{0.82}Ga_{0.18}N$:Si), lower cladding 206 may be polarization doped and graded AlGaN (e.g., Si-doped AlGaN having a composition gradient, such that it comprises n-$Al_{0.82}Ga_{0.18}N$ near the electron injection layer interface and AlN near the active region interface), MQW structure 208 may include alternating well and barrier layers of AlGaN, upper cladding 207 may be polarization doped and graded AlGaN (e.g., Si-doped AlGaN having a composition gradient, such that it comprises AlN near the active region interface and n-$Al_{0.82}Ga_{0.18}N$ near the p-type layer interface), p-type layer 210 may be a p-type GaN layer, current tunneling layer 211 may be a layer of $Al_2O_3$, and hole injection layer 212 may be a layer of single-crystalline or polycrystalline Si.

Figure 9:
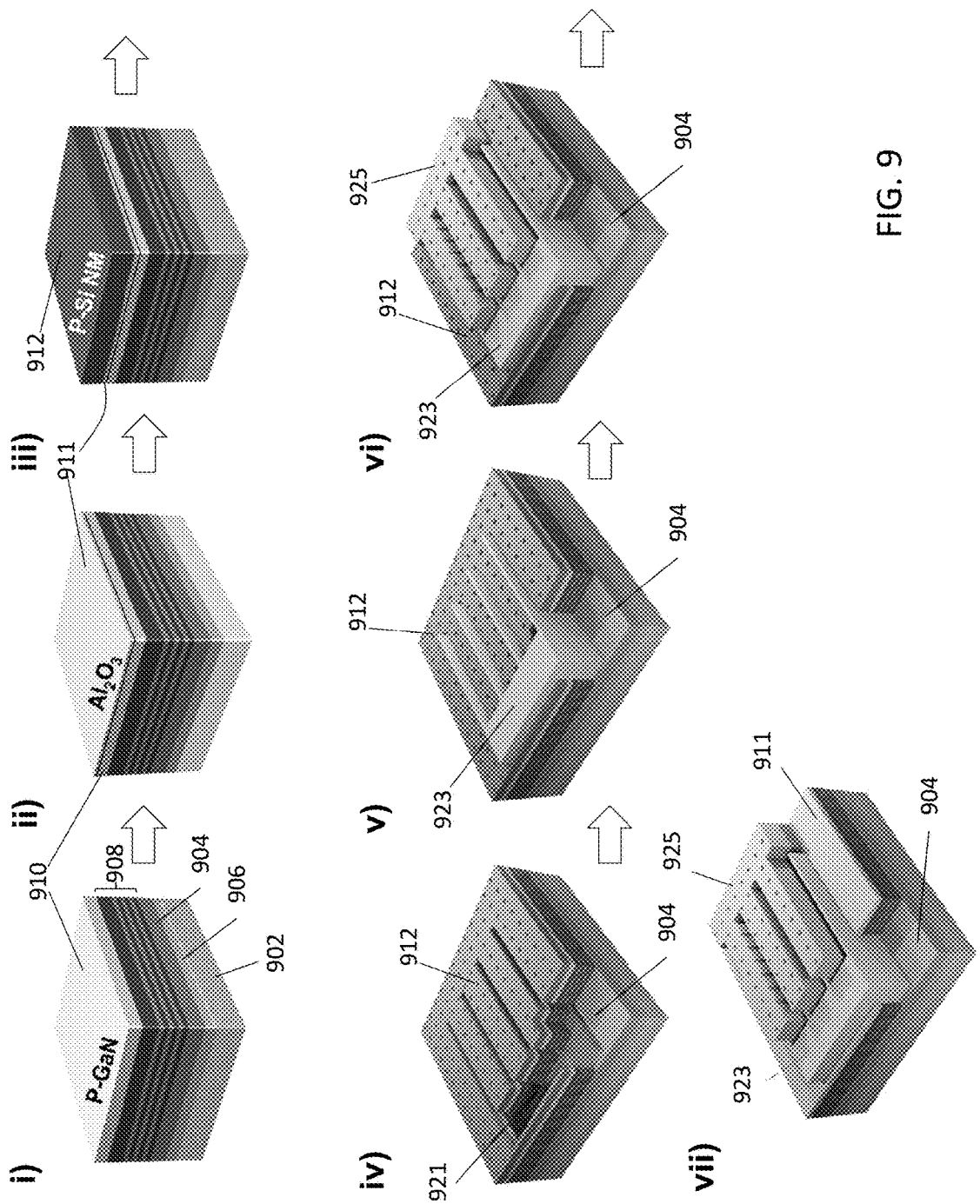
FIG. 9 is a schematic illustration of a method for fabricating an LED of the type shown in FIG. 7.

One embodiment of a method for forming a light emitting device is shown schematically in FIG. 9. Panel (i) in FIG. 9 shows a heterostructure that includes substrate 902, a buffer layer 906, n-type doped electron injection layer 904, active region 908, and p-type layer 910. This heterostructure can be fabricated using existing epitaxial growth techniques, such as molecular beam epitaxy (MBE). Upon the upper surface of the p-type layer, a current tunneling layer 911 is deposited (panel (ii)). Current tunnel layer 911 can be deposited using, for example, atomic layer deposition (ALD). The thickness of the current tunneling layer typically need only be on the order of the root mean square (rms) roughness of the surfaces of the layers of semiconductor material which it binds. By way of illustration, in some embodiments, the current tunneling layer has a thickness in the range from about 0.5 to about 10 nm. This includes embodiments in which it has a thickness in the range from about 0.5 to about 5 nm or from about 0.5 to about 3 nm. Since the thickness of the current tunneling layer may not be uniform on an atomic scale, the thickness of the layer corresponds to the average thickness of the layer across the bonding interfaces of the heterostructure.

Once current tunneling layer 911 is formed, a layer of pre-formed, single-crystalline, p-type doped semiconductor material 912 can be placed on its upper surface to provide the p-layer of the pin diode structure, as shown in panel (iii) of FIG. 9. This can be achieved using a Si NM transfer and bonding process, as illustrated in the Examples. The bonding between the transferred layer of single-crystalline p-type doped semiconductor material and the current tunneling layer can be enhanced by annealing. Next, a cathode mesa 921 is etched through the heterostructure down to n-type doped electron injection layer 904 (panel (iv)) and a cathode 923 is deposited using, for example, metallization (panel (v)). An anode 925 is then deposited on the single-crystalline p-type doped semiconductor material 912 using, for example, metallization (panel (vi)) and the remaining single-crystalline p-type doped semiconductor material is removed (panel (vii)).

The method of transferring a pre-formed single-crystalline p-type doped semiconductor layer onto the current tunneling layer can be carried out starting with a semiconductor-on-insulator substrate comprised of a handle wafer, such as a Si handle wafer, a buried oxide layer, and a thin layer of the p-type doped single-crystalline semiconductor, such as a thin layer of single-crystalline p-type Si or p-type Ge. Buried oxide layer is selectively removed from the structure. This can be carried out, for example, by forming an array of holes (apertures) through the thin layer of single-crystalline semiconductor and then selectively chemically etching away the buried oxide layer that is exposed through the apertures. These apertures may be regularly spaced, or randomly spaced. As a result, the thin layer of single-crystalline semiconductor settles onto the underlying handle wafer. A host material, such as a rubber stamp, is then pressed onto the upper surface of the released layer of the single-crystalline semiconductor, which adheres to the host material and is lifted away from the handle wafer. In a subsequent step the released layer of single-crystalline semiconductor is brought into contact with, and transferred onto, the current tunneling layer. The single-crystalline layer can be doped before or after transfer and bonding. The host material is then removed. A more detailed description of this type of transfer and bonding process can be found in U.S. patent publication number 2016/0204306.

An alternative method of transferring a single-crystalline p-type doped semiconductor layer onto the p-type layer uses wafer bonding followed by hydrogen implantation to create a splitting plane in the semiconductor material—a technique that is sometimes referred to as Smart Cut. A description of the Smart Cut process can be found in Bruel et al., *Proceedings 1995 IEEE International SOI Conference*, 178 (1995). In this technique, a buried hydrogen implantation layer is formed in a p-type doped semiconductor substrate, such as a semiconductor wafer. The depth of hydrogen implantation layer will determine the thickness of the single-crystalline p-type doped semiconductor layer to be transferred. Once the splitting plane is formed via hydrogen implantation, the surface of substrate is contacted with the current tunneling layer on the previously grown heterostructure. The substrate is then split at the hydrogen implantation layer and the bulk of the substrate is removed. Optionally, the single-crystalline p-type doped semiconductor layer may be thinned using a post-transfer chemical mechanical polish.

As an alternative to single-crystalline silicon, polycrystalline silicon can be used as a hole injection layer. A thin film of polycrystalline silicon can be deposited on the current tunneling layer using, for example, low pressure chemical vapor deposition (LPCVD).

Neighboring layers of the heterojunctions that are fabricated using transfer and bonding processes or LPCVD over a current tunneling layer do not have an epitaxial structure. As used herein the term "epitaxial structure" refers to a structure in which the crystallographic orientation of an overlying layer is determined by (matches) that of its underlying layer, such that the two layers have the same crystallographic orientation, at least in the area of their interface. Such epitaxial structures may include strains and stresses at the interface, induced by a lattice mismatch between the two materials and may even include misfit dislocations. In contrast to such epitaxial structures, non-epitaxial layers in the present structures have crystallographic orientations that are independent from (e.g., different from) those of their neighboring layers. As such, the layers that do not have an epitaxial structure are free of lattice mismatch-induced strains or stresses and lattice mismatch-induced misfit dislocations. In fact, the semiconductor materials selected for the hole injection layer and the p-type layer of the p-type contact can have a lattice constant mismatch that would render them unsuitable for epitaxial growth—even in the presence of an intermediate buffer layer.

In some embodiments, the inorganic material of the current tunneling layer is an oxide. In such embodiments, the oxide can comprise, consist of, or consist essentially of, a metal oxide, an oxide of a semiconductor element or an oxide of a metalloid element. Examples of oxides that may be used in metal oxide current tunneling layers include, but are not limited to, those that can be deposited via atomic layer deposition (ALD). Examples of such metal oxides include aluminum oxide ($Al_2O_3$), titanium oxide ($TiO_2$), hafnium oxide ($HfO_2$), tantalum oxide ($Ta_2O_5$), and silicon dioxide ($SiO_2$). In some embodiments, the metal, semiconductor or metalloid elements present in the oxide are different from any metal, semiconductor or metalloid elements in the other semiconductor layers with which they are in contact and between which they are disposed. In the p-type contacts, the inorganic oxide of the current tunneling layer is not a native oxide of the single-crystalline p-type semiconductor material of the hole injection layer; nor is it a native oxide of the p-type semiconductor (e.g., p-GaN) of the p-type layer. (As used herein, the term native oxide refers to an oxide that would be monolithically formed on the semiconductor material as the result of the oxidation of the material in an oxygen-containing environment. For example, $SiO_2$ is a native oxide of Si.)

In other embodiments, the inorganic material of the current tunneling layer is a nitride. In such embodiments, the nitride can comprise, consist of, or consist essentially of, a metal nitride, a nitride of a semiconductor element or a nitride of a metalloid element. Examples of nitrides that may be used in nitride current tunneling layers include, but are not limited to, those that can be deposited via atomic layer deposition (ALD). Examples of such nitrides include aluminum nitride, silicon nitride, and titanium nitride. In some embodiments, the metal, semiconductor or metalloid elements present in the nitride are different from any metal, semiconductor or metalloid elements in the semiconductor layers with which they are in contact and between which they are disposed.

In some embodiments, the current tunneling layer comprises two or more sub-layers, each of which comprises an inorganic material, provided, however, that the total combined thickness of the sub-layers is still low enough to allow for the tunneling of electrons and holes through the layer. For example, in a current tunneling layer comprising multiple sub-layers of inorganic oxides, the inorganic oxides can be selected such that one oxide passivates one of the two neighboring semiconductor materials, while another oxide passivates the other of the two neighboring semiconductor materials.

The semiconductor materials of the hole injection layer and the p-type layer are dissimilar, such that there is a band offset in the electronic energy band diagram of the heterojunctions formed by the two materials. Because the hole injection layer is not grown epitaxially from the p-GaN layer, the hole injection layer need not be a group III-V semiconductor. Thus, the single-crystalline or polycrystalline semiconductor material used for the hole injection layer can be independently selected from a broad range of p-doped semiconductors, including p-doped group IV semiconductors and p-doped group II-VI semiconductors. The group IV semiconductors include elemental semiconductors (e.g., Si, Ge and C, including diamond), as well as alloy and compound semiconductors (e.g., SiGe:C, SiGe, SiGeSn and SiC). A benefit of using single-crystalline or polycrystalline silicon as the hole injection layer material is that it can act as a light reflector for radiation having wavelengths below about 300 nm and particularly for radiation having wavelengths below about 260 nm, as illustrated in Example 5. As a result, bottom-emitting devices that include silicon hole injection layers can provide enhanced light output relative to bottom-emitting devices that use more conventional contact materials, such as Al.

The semiconductor material of the hole injection layer is heavily doped. Generally, a degenerate doping level is desired, such that the material acts more like a metal than a semiconductor. By way of illustration, the semiconductor of the hole injection layer can have a dopant concentration of at least $1\times10^{19}$ cm$^{-3}$. One embodiment of a hole injection layer material is boron-doped single-crystalline silicon.

The semiconductor material of the p-type layer is composed of p-doped GaN, such as Mg-doped GaN, or another p-doped group III-V nitride, which provides an electrically conductive path. Like the semiconductor material of the hole injection layer, the semiconductor material of the p-type layer is heavily doped and may be degenerately doped. Although, the dopant concentration of the p-type layer may be lower than the dopant concentration of the hole injection layer. By way of illustration, the semiconductor of the p-type layer can have a dopant concentration of at least $1\times10^{18}$ cm$^{-3}$.

The layers of semiconductor material that make up the active region (e.g., the well and barrier layers of the MQW structure and any spacer layers), the n-type doped semiconductor material of the electron injection layer, and, optionally any buffer layers, and/or substrate can be comprised of group III-V nitride semiconductors. The group III-V nitride semiconductors include binary, ternary and higher order compound semiconductors. Examples of group III-V nitride semiconductors include GaN, AlN, InN, AlGaN, InGaN and InAlN.

The thicknesses of the layers of semiconductor materials that make up the devices will depend on the intended light-emitting device application. However, by way of illustration, in some embodiments of the devices, some or all of the layers of single-crystalline material have thicknesses of no greater than about 1000 nm. If the semiconductor materials of the charge injection layers and/or the doped contact layers absorb radiation within the emission wavelength range of the active region, it is advantageous to limit the thickness of these materials. For example, these doped semiconductor layers may have a thickness of 100 nm or less, including thicknesses of 50 nm or less, 20 nm or less, and 10 nm or less.

In order to take advantage of the hole injection function of the p-type semiconductor of the p-contact, as explained in Example 1, the p-GaN contact layer is desirably quite thin. If the p-GaN is sufficiently thin it will be completely depleted and all of the injected holes will come from the p-type semiconductor hole injection layer, such that the p-type semiconductor controls hole injection. Thus, in some embodiments of the devices, the p-GaN contact layer has a thickness of no greater than 50 nm. This includes embodiments in which the p-GaN layer has a thickness of no greater than 30 nm and further includes embodiments in which the p-GaN layer has a thickness of no greater than 20 nm.

The wavelengths of the radiation emitted by the light-emitting devices will depend on the semiconductor materials used in the active region. For example, with the proper selection of materials, the light-emitting devices can be configured to emit in the ultraviolet (UV; wavelengths from ~100 to 400 nm, including the deep ultraviolet (DUV) with wavelengths below 250 nm, e.g., in the range from 220 to 240 nm) and/or in the visible (vis; wavelengths from 400 to 780 nm, including blue light with wavelengths in the range from 430 to 470) regions of the electromagnetic spectrum. By way of illustration, a light-emitting device designed to emit light in the wavelength range from about 220 to 240 nm could employ an active region having an MQW structure comprising alternating layers of single-crystalline, high aluminum-content, AlGaN quantum well layers and single-crystalline AlN barrier layers. This active region can be grown epitaxially over an n-type AlGaN electron injection layer. A light-emitting device designed to emit blue light could employ an active region having an MQW structure comprising alternating layers of single-crystalline InGaN quantum well layers and single-crystalline GaN barrier layers. This active region can be grown epitaxially over an n-type GaN electron injection layer.

EXAMPLES

Example 1: Deep Ultraviolet-Emitting LED

In this example, bulk AlN substrates were adopted to grow Ga-face high Al composition AlGaN epitaxial heterostructures that alleviate the efficiency degradation induced by dislocation recombination centers. The material growth qualities of the AlGaN in the UV LED and the post-Si nanomembrane (Si NM) transfer properties of the UV LED were characterized by XRD and PL.

To tackle the problems of poor hole injection and poor p-side conductivity, a heavily p-type doped single crystalline Si nanomembrane (Si NM) was bonded to the i-AlN/ $Al_{0.72}Ga_{0.28}N$ MQW planar epitaxially grown structure. At the completion of Si NM bonding, the bonded device layers were characterized again using XRD. UV LEDs were fabricated using mesa etching processes. Device performance was characterized by electroluminescence (EL) measurements, including current density-voltage characteristics and EL spectrum intensity as a function of current density. No degradation of emitted light intensity was observed up to a current density of 245 A/cm$^2$, for the peak emission wavelength of 237 nm. The efficiency droop-free behavior is attributed to the large concentration of holes supplied by the p-type Si NM. The EL spectrum is dominated by the peak at 237 nm and lacks any significant parasitic emission, which is common in UV LEDs and degrades efficiency. A record light output power of 265 pW was measured without using any light extraction structure. Furthermore, the enhanced hole injection mechanism is explained below through a proposed band alignment arising from an in-depth examination of the hole transport across the p-Si/p-GaN heterojunction.

Results

Growth of Epitaxial Structure and Formation of Si NM Hole Injection Layer

The layer structure for the three-dimensional UV LED structure is illustrated in FIG. 1. The structure was grown on an AlN substrate by low pressure organometallic vapor phase epitaxy (LP-OMVPE) in a custom high-temperature reactor. The Al, Ga, N, Si, and Mg precursors were trimethylaluminum, triethylgallium, ammonia, silane, and bis (cyclopentadienyl)-magnesium, respectively, in a hydrogen diluent. As shown in FIG. 1, following an initial 400 nm AlN homoepitaxial layer, the epitaxial portion of the active device is comprised of a Si doped 600 nm n-$Al_{0.74}Ga_{0.26}N$ electron injection layer, a 3-period 2 nm $Al_{0.72}Ga_{0.28}N$/6 nm AlN MQW active region, and a 28 nm AlN electron blocking layer (EBL).

Following the AlN EBL, a 20 nm Mg doped p-GaN p-type layer was grown to circumvent the oxidation of the AlN surface. On top of the epitaxial layer, a 0.5 nm $Al_2O_3$ current tunneling layer was deposited by atomic layer deposition (ALD) after cleaning by the standard RCA method. The 0.5 nm $Al_2O_3$ layer acts as a quantum tunnel layer and also a passivation layer to form the lattice-mismatched heterojunctions of the multilayered p-contact. A p-type doped ($5\times10^{19}$ cm$^{-3}$) single-crystalline Si NM hole injection layer, which was pre-released from a silicon-on-insulator (SOI) substrate, was then transferred to the top of the $Al_2O_3$ layer, followed by a rapid thermal anneal (RTA) at 500° C. for 5 minutes. The RTA procedure was intended to activate the chemical bonding process and to increase the bonding strength between the p-Si NM and $Al_2O_3$. In this LED design, light is only emitted through the n-AlGaN and AlN substrate as all emission in the opposite direction is either absorbed or reflected by p-GaN and p-Si. However, the AlN substrates have significant absorption in the UV spectral range so substrates were thinned to 20 μm to reduce absorption losses prior to dicing into chips for EL evaluation. Even after thinning, absorption loss is estimated to be greater than 50%.

Figure 2:
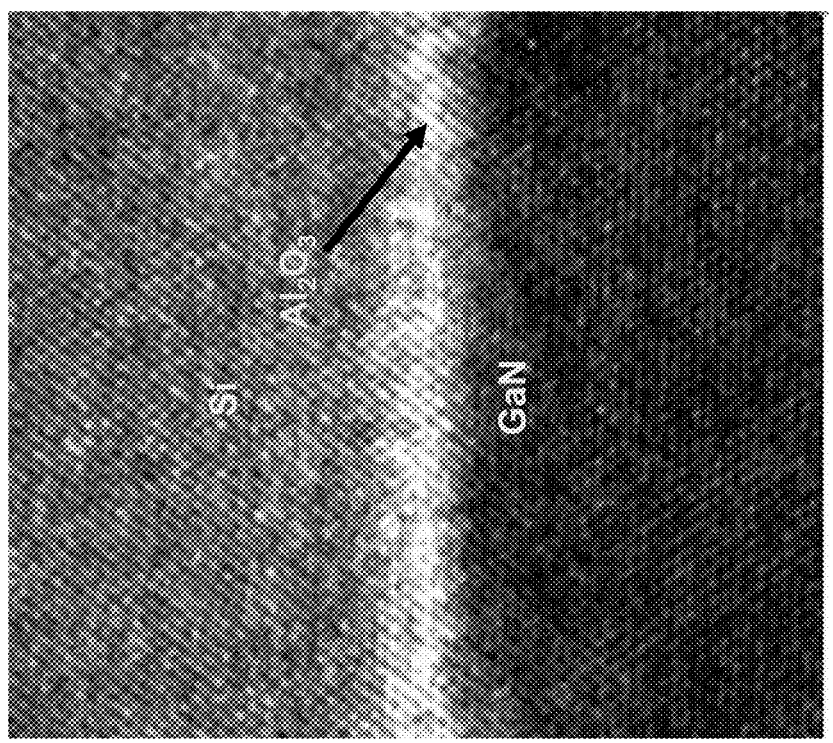
FIG. 2 is an HRTEM image of a p-Si/Al$_2$O$_3$/p-GaN heterojunction.
Figure 3:
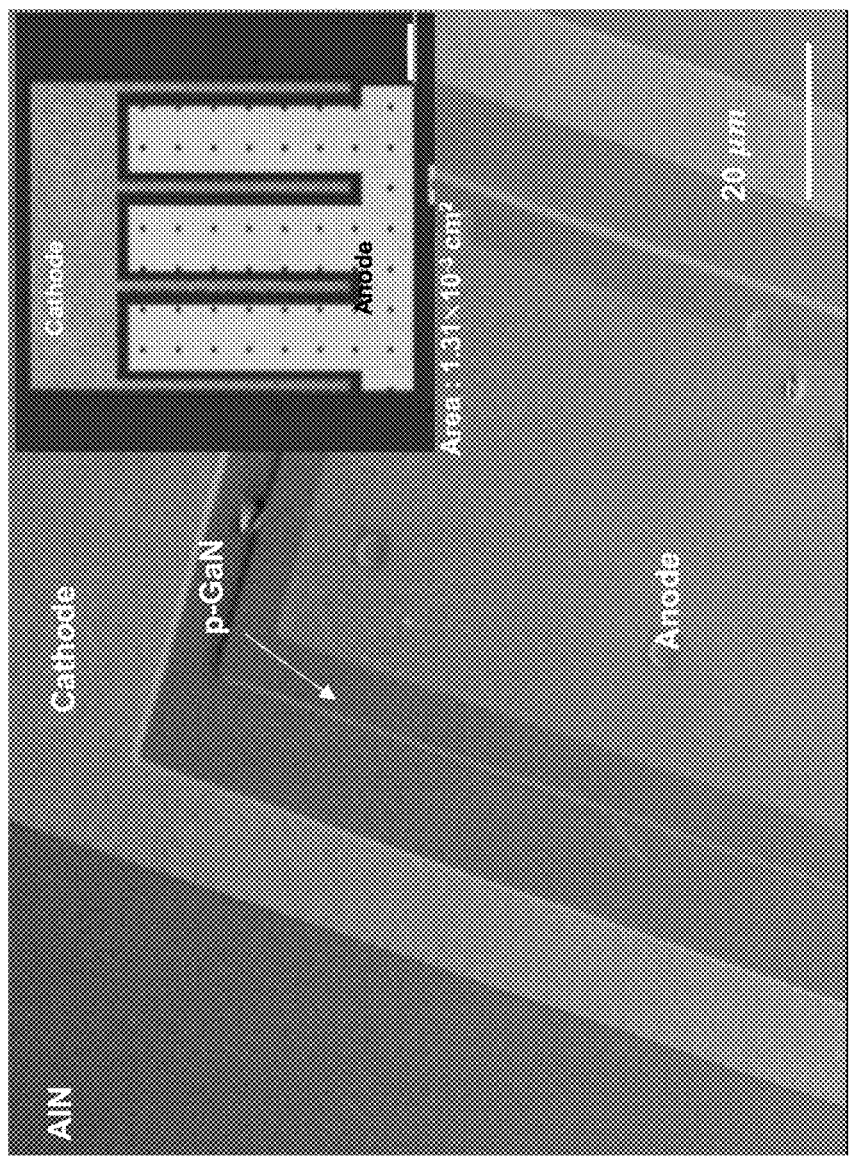
FIG. 3 is an SEM image, corresponding to an area of the inset optical microscopic image, of a fabricated UV LED with one anode finger between two cathode fingers. The scale bar is 20 μm and the device area is 1.31×10$^{-3}$ cm$^2$.

A high-resolution transmission electron microscope (HR-TEM) image of the interface between Si and GaN is shown in FIG. 2. The HRTEM image shows that an interfacial layer of 0.46-0.99 nm with an average thickness of 0.70 nm was formed. Since ALD deposition can accurately control the thickness of the $Al_2O_3$, the slightly increased interface thickness indicates variations in the $Al_2O_3$. The thicker $Al_2O_3$ in some locations is presumably due to chemical reactions and/or diffusion of $Al_2O_3$ into p-GaN and/or p-Si during the RTA annealing procedure. From the HRTEM, it can also be seen that the $Al_2O_3$ current tunneling layer was partially re-crystallized. FIG. 3 shows an SEM image of a part of a fabricated UV LED and an optical microscopic image of the entire device is shown in the inset of FIG. 3. Under forward bias the LED emitted weak blue light. The weak blue light is likely from the p-GaN and deep levels elsewhere in the device and is commonly reported in the UV LED literature.

Characterizations of a p-Si/Al$_2$O$_3$/p-GaN Isotype Heterojunction

Figure 4A:
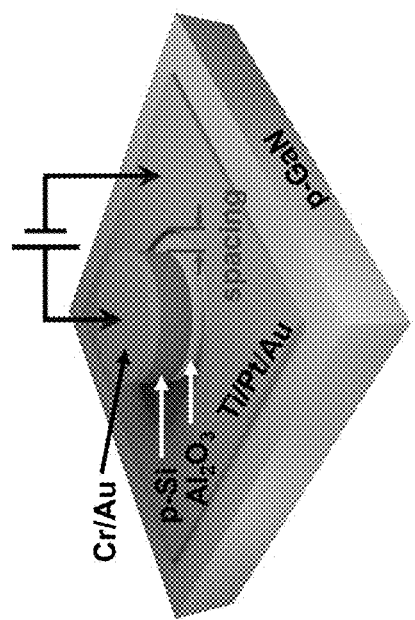
FIG. 4A is a 3d illustration of a p-Si/Al$_2$O$_3$/p-GaN isotype heterojunction test structure. The deposited thickness of Al$_2$O$_3$ by ALD is 0.5 nm. The p-GaN thickness for this testing structure is 200 nm.
Figure 4B:
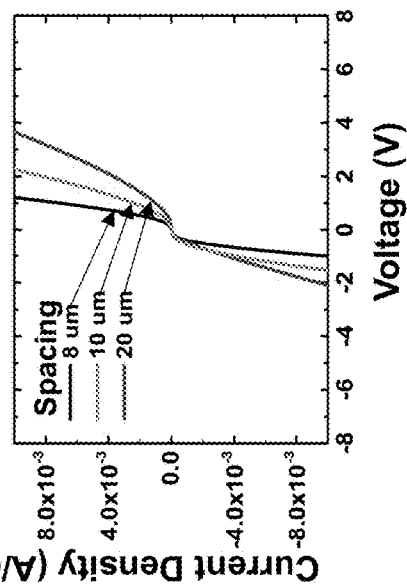
FIG. 4B depicts measured electrical characteristics of the p-Si/Al$_2$O$_3$/p-GaN heterojunction with different distances between metal contacts.
Figure 4C:
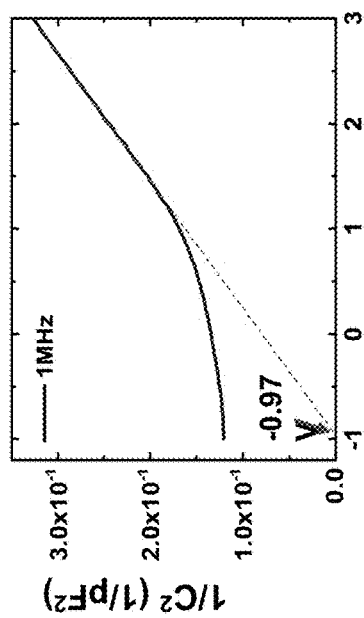
FIG. 4C depicts measured 1/C$^2$ versus voltage at 1 MHz with an 8 μm gap distance between metal contacts.
Figure 4D:
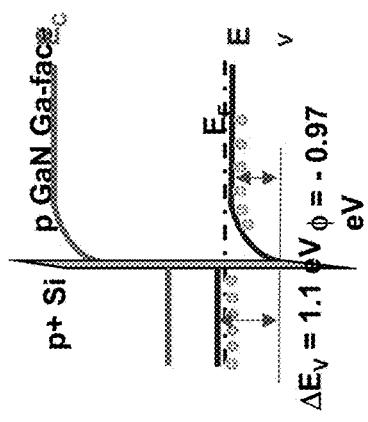
FIG. 4D depicts the proposed band alignment of the p-Si/Al$_2$O$_3$/p-GaN under equilibrium that is responsible for the improved hole injection for the UV LEDs. The charge symbols were drawn for holes.

To confirm efficient hole injection from p-Si, the electrical characteristics of a p-Si/Al$_2$O$_3$/p-GaN isotype heterojunction (FIG. 4A) were examined. Note that in this test structure 200 nm p-GaN was used, in contrast to 20 nm GaN used in the UV LEDs. The current-voltage curves that were measured from the p-Si/Al$_2$O$_3$/p-GaN isotype heterojunction, plotted in linear scale, are shown in FIG. 4B. The curves indicate nearly Ohmic behavior with a turn-on voltage as small as 0.3 V. As the spacing between the metal contacts increased from 8 µm to 10 µm and to 20 µm, the current decreased for a given voltage, as expected, due to larger lateral current spreading resistance in the p-GaN region. Furthermore, the capacitance-voltage (C-V) measurement of the p-Si/Al$_2$O$_3$/p-GaN heterojunction was carried out at a frequency of 1 MHz. The flat-band voltage was extracted to be −0.97 V from the 1/C$^2$-V plot (FIG. 4C), which indicated a built-in potential Φ of −0.97 eV for the p-Si/Al$_2$O$_3$/p-GaN heterojunction. Since the doping concentration of p-Si (5×10$^{19}$ cm$^{-3}$) was more than one order of magnitude higher than that of p-GaN (1×10$^{18}$ cm$^{-3}$), it is reasonable to assume that the built-in potential mainly originated from the p-GaN (one-sided junction), which was manifested as a 0.97 eV downward band bending of the Ga-polar surface in the p-GaN, as shown in FIG. 4D. Additionally, X-ray photoelectron spectroscopy (XPS) was employed to examine the surface/interface of p-GaN with Al$_2$O$_3$ ALD deposition, which revealed a downward band bending value of 1.00 eV, roughly consistent with the 0.97 eV band bending from the C-V analysis.

Based on the measurements of the built-in potential, the valence band offset between p-Si and p-GaN can be determined by the following expression:

$$\Phi = \Delta E_v - \delta_{p\text{-}Si} + \delta_{p\text{-}GaN} \quad (1)$$

where Φ is the built-in potential, extracted as −0.97 eV. (See, S. M. Sze, et al., *Physics of Semiconductor Devices*. John Wiley & Sons, New York, 2007.) The energy differences, $\delta_{p\text{-}Si}$ and $\delta_{p\text{-}GaN}$, between Fermi levels and valence bands ($E_F$-$E_V$) for heavily doped p-Si and p-GaN (assuming an acceptor activation ratio of 10%) were calculated as −0.002 eV and 0.12 eV, respectively. Therefore, the valence band offset |ΔE$_v$| is 1.092 eV for the p-Si/Al$_2$O$_3$/p-GaN heterojunction. In comparison to the intrinsic |ΔE$_v$| value of 2.32 eV, which is obtained directly from the electron affinity rule, the energy barrier for hole transport from p-Si to p-GaN was substantially lowered. As a result, a much larger concentration of holes can be injected from Si into the MQW. This difference in energy barrier stems from the negative polarization charges on the surface of the Ga-face GaN, as well as a voltage drop across the interfacial layer induced by the polarization charge. It is noted that it is the use of 0.5 Al$_2$O$_3$ current tunneling layer, which served as an effective passivation layer for both Si and GaN, that caused the reduced band downward bending of Ga-face GaN, and thus the reduced barrier height for hole transport.

Figure 5A:
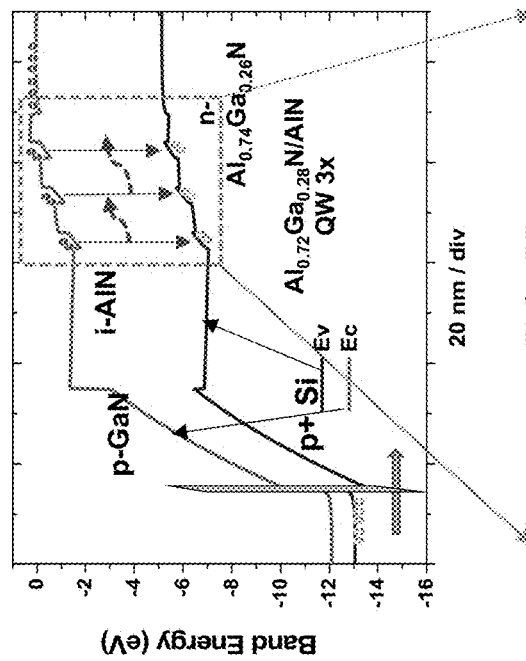
FIGS. 5A-5D depict an electrical simulation on an LED structure consisting of p-Si/Al$_2$O$_3$/p-GaN/i-AlN/Al$_{0.72}$Ga$_{0.28}$N/AlN QWs/n-Al$_{0.74}$Ga$_{0.26}$N.
Figure 5B:
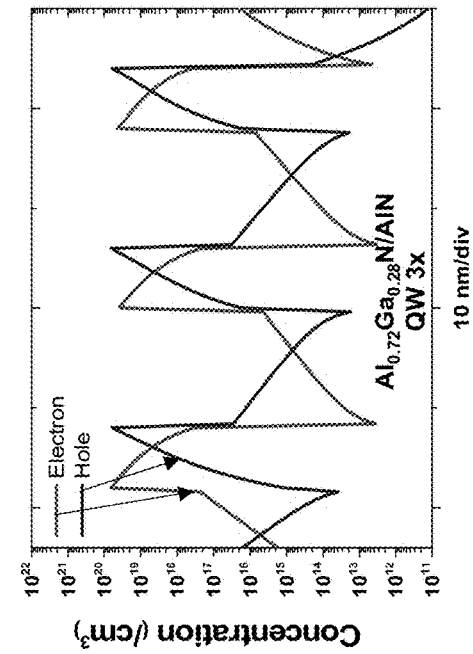
Figure 5C:
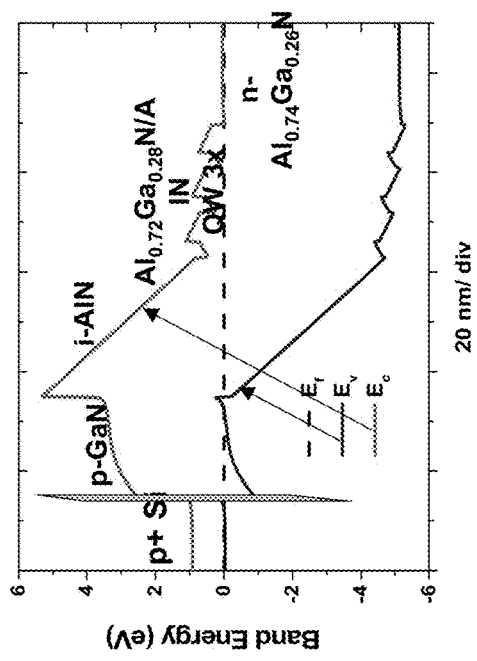
Figure 5D:
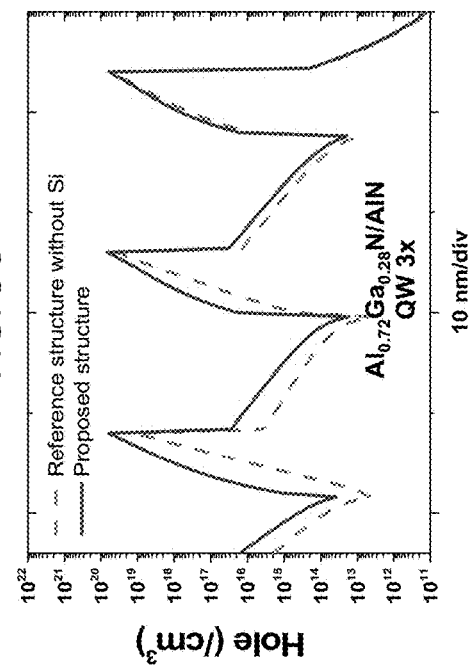

Based on the above analyses of the surface band bending and interface-induced valence band offset shift, the band alignment of the p-Si/Al$_2$O$_3$/p-GaN isotype heterojunction under equilibrium is depicted in FIG. 4D and the band alignment for the entire LED structure composed of p-Si, p-GaN, i-AlN, i-AlN/Al$_{0.72}$Ga$_{0.28}$N MQWs, and n-Al$_{0.74}$Ga$_{0.26}$N contact layer under zero bias (equilibrium) is plotted in FIG. 5A. Under forward bias, the energy barrier for hole transport from p-Si to p-GaN was further lowered by the externally applied potential, allowing holes to flow, which thus enabled efficient hole transport, as supported by the electrical measurements. The band alignment for the entire LED structure under forward bias (current density: 240 A/cm$^2$) is plotted in FIG. 5B. Abundant holes from the p-type Si tunneled through the thin Al$_2$O$_3$ layer into p-GaN. Hole accumulation occurred at the interface adjacent to the p-AlN due to band bending from the combined effects of the built-in potential and forward bias applied. In this LED structure, it is the p-Si, not the p-GaN, that supplied holes. As a result, the p-Si serves as both the hole injector and a contact layer. As a comparison, the hole concentration for the LED structure without Si was simulated as well and plotted against that of our proposed structure as shown in FIG. 5C. It is observed that the hole density, especially within the first two wells are significantly enhanced by the utilization of the Si hole injection layer. Eventually, the injected holes recombine with electrons injected by the n-Al$_{0.74}$Ga$_{0.26}$N within the Al$_{0.72}$Ga$_{0.28}$N/AlN quantum wells for light emission at 237 nm. FIG. 5D shows the electron and hole concentration distributions within the QWs region, which confirms the hole injection and the resultant balance between electrons and holes. It is worth mentioning that with forward bias the valence band discontinuity |ΔE$_v$| could be further reduced, as voltage drop across the interfacial Al$_2$O$_3$ layer increases under forward bias. Significantly, the p-Si hole injector approach used in this example is readily applicable to UV LEDs covering a range of wavelengths. As the UV wavelengths become shorter, impurity p-type doping becomes even more inefficient in the related nitride materials. As a result, the novel p-Si hole injector approach is a critical solution for UV LEDs of very short wavelengths.

Crystallinity and Strain Characterizations of Device Structure

It is crucial to maintain strain-free bonding during the bonding process, since the strain in the Si NM can create unwanted band bending or even surface states at the interface. High resolution XRD (PANalytical X'pert Pro MRD) with a Cu-Kα1 radiation source (λ=1.5406 Å) and a Horiba LabRAM ARAMIS Raman confocal microscope with an 18.5 mW He—Ne (532 nm) green laser were used to assess the crystalline quality and strain after the Si NM was bonded with a AlN/AlGaN structure. Prior to the AlN homoepitaxial layer growth, the AlN substrate was examined by a high-resolution XRD rocking curve, and the very narrow FWHM indicated high crystalline quality. The XRD 2-theta-omega scan range from 30° to 80° at ~0.05° step taken from the p-Si/Al$_2$O$_3$/p-GaN/i-AlN/i-Al$_{0.72}$Ga$_{0.28}$N/AlN MQW/n-Al$_{0.74}$GaN$_{0.26}$/AlN structure shows three peaks corresponding to the AlGaN (002) direction, Al$_2$O$_3$ (002), and Si (001) directions, respectively. Full width at half maximum (FWHM) values of 0.0750 and 0.1° from AlGaN and Si indicate that both the AlGaN epi-layer and transferred Si NM layer maintained good crystallinity during the transfer/bonding processes. The appearance of the weak Al$_2$O$_3$ peak at 42.1 degree in the XRD spectrum indicates the existence of crystalline Al$_2$O$_3$, which may be attributed to the re-crystallization of the ALD interfacial Al$_2$O$_3$ during the annealing process. The weak intensity and the wide FWHM is attributed to small thickness and may also imply that the ALD deposited Al$_2$O$_3$ was only partially crystallized. The Al$_2$O$_3$ peak appearing in the XRD spectrum is consistent with the interface HRTEM image (FIG. 2). A Raman spectrum indicated that the Si peak and the AlGaN peaks appeared at 520.8 cm$^{-1}$ and 660.8 cm$^{-1}$/860 cm$^{-1}$, respectively, confirming that the transferred Si NM as well as AlGaN epi-layers were free of strain induced by the bonding process, even after thermal anneal, which is crucial to form stable heterostructures.

Electrical and Optical Characteristics

Figures 6A, 6B:
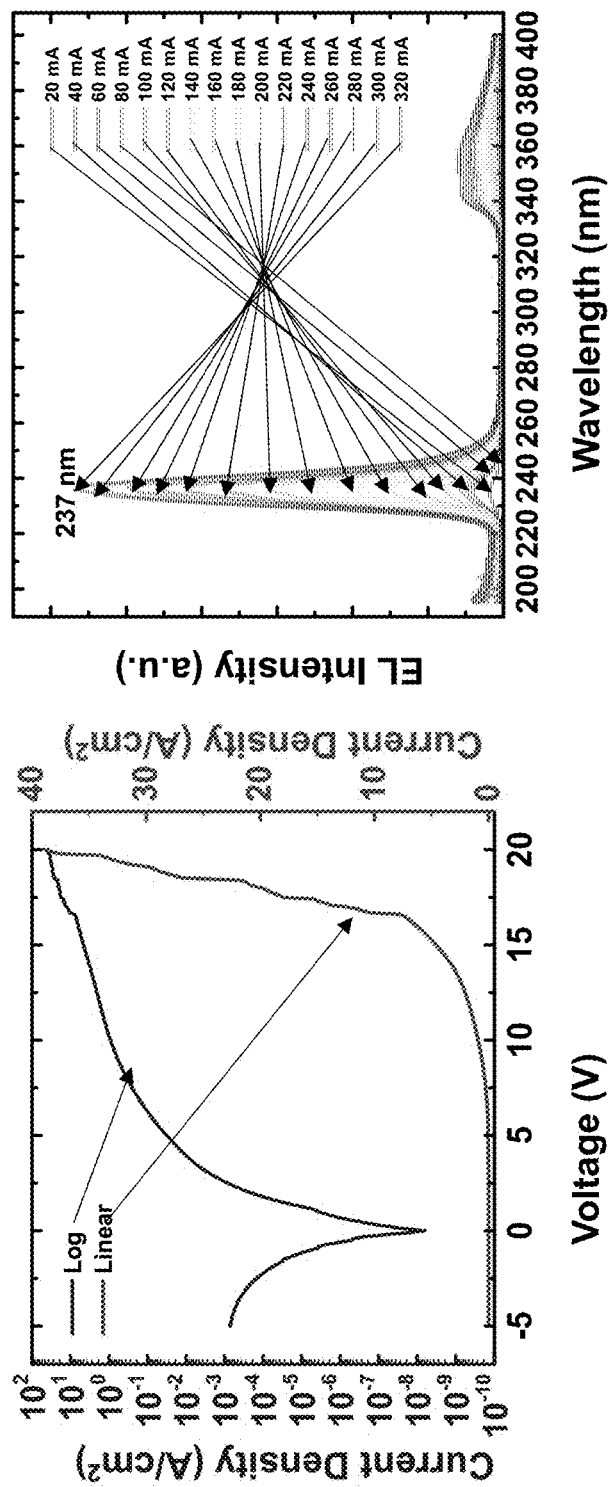
FIGS. 6A-6C depict electrical characteristics and electroluminescence performance of a 237 nm UV LED.
Figure 6C:
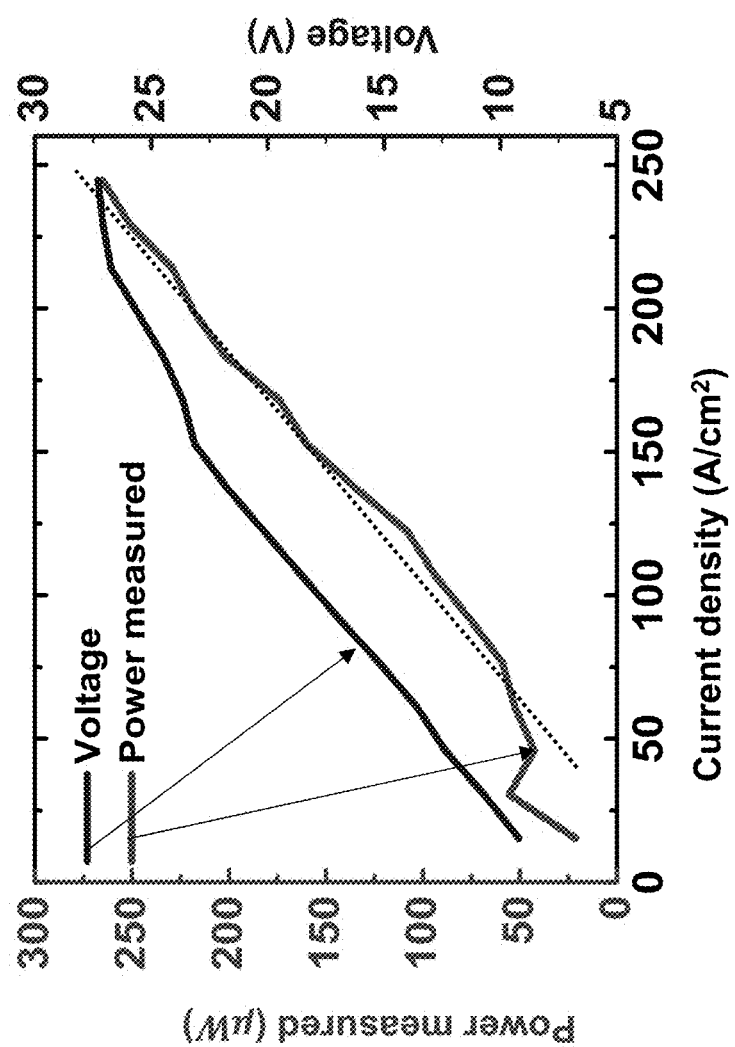

The measured current density-voltage (J-V) plot for the 237 nm LED (FIG. 6A) shows its rectifying characteristics. The maximum applied current density was limited by Keithley 4200 Semiconductor Parameter Analyzer. EL spectra and optical power measurements were performed by coupling the UV LED emission (without using any light extraction fixture) into the 6-inch integrating sphere of a Gooch and Housego OL 770-LED calibrated spectroradiometer. Electrical power was supplied in constant current mode and the temperature was not controlled, so LEDs were allowed to self-heat. The linear scale of the EL spectra for various currents from 20 mA to 320 mA are depicted in FIG. 6B, where the 237 nm emission peak from the $Al_{0.72}Ga_{0.28}N/AN$ MQWs is the dominant spectral feature. With the current ranging from 20 mA to 320 mA, the intensity of the 237 nm emission peak monotonically increases with increasing drive. Alongside the main peak emission, there is another rather weak parasitic peak detected in the near-UV range. The measured light output power and applied voltage versus the current density (L-I-V) of the LED is plotted in FIG. 6C. It can be seen that the light output power increases linearly with current density up to 245 A/cm$^2$, which is equivalent to a current of 320 mA. This linear behavior implies an absence of efficiency droop in this range, which directly results from the use of p-type Si as the hole injection layer. The large hole density improves quantum efficiency by providing a better balance of electrons and holes than the conventional nitride-based p-type injectors. Besides the efficiency droop-free behavior, 265 µW output power was measured from the UV LED at the current density of 245 A/cm$^2$ with an external voltage bias of 27.3 V, corresponding to an external quantum efficiency of 0.016% and a wall-plug efficiency of 0.003%.

Example 2: Blue Light-Emitting LED

A blue light emitting LED is fabricated using the same procedures described in Example 1, except that the active region is grown on an n-type contact comprising crystalline n-type doped GaN (n-GaN) grown to the thickness of 600 nm. Upon the n-type contact layer a MQW structure comprising alternating 6 nm thick GaN barrier layers and 3 nm thick $In_xGa_{1-x}N$ well layers, where x is 0.2. This active region is designed to emit light having wavelengths in the blue region of the visible spectrum. A p-type doped GaN layer is grown to a thickness of 50 nm atop the final barrier layer and a thin layer (~0.5 nm) of aluminum oxide current tunneling layer is deposited over the p-GaN via ALD. A hole injection layer of single-crystalline p-type doped silicon (p-Si) is then transferred onto, and bonded to, the aluminum oxide.

To complete the structure, a cathode mesa is etched down to the n-GaN contact layer by ICP with a $Cl_2/BCl_3/Ar$ gas mixture and a metal cathode stack of Ti/Al/Ti/Au (10 nm/100 nm/10 nm/200 nm) is deposited in the mesa. A metal current spreading layer of Ni/Au (5 nm/5 nm) is then deposited on the upper surface of the p-Si hole injection layer and an anode metal stack of Ti/Au (10 nm/200 nm) is deposited over the current spreading layer Finally, a dielectric ($SiO_2$) isolation and passivation layer is grown over the structure via plasma-enhanced chemical vapor deposition (PECVD) and interconnects are formed in the passivation layer to provide electrical contact with an external device.

Example 3: Deep Ultraviolet Edge-Emitting Laser

An edge-emitting laser was simulated to examine the transverse distribution of its fundamental mode. The laser had the structure shown in FIG. 7, where the upper and lower cladding were 100 nm thick p- and n-graded AlGaN (from AlN to $Al_{0.7}Ga_{0.3}N$) layers and the active region comprised 20 pairs of QWs (1.5 nm $Al_{0.75}Ga_{0.25}N$/4.5 nm Al $0_{0.55}Ga_{0.45}N$). The upper and lower cladding function simultaneously as cladding layers and to confine the light in the active quantum well region, thereby reducing the light absorption associated with p-GaN and p-Si of the p-type contact. The optical confinement factor within the QWs region is calculated to be about 2.6% and the required material gain threshold for lasing is around 7000 cm$^-$.

Example 4: Blue Light-Emitting Diode

This example illustrates the fabrication and operation of an InGaN/GaN blue LED that includes a multilayered p-type contact. To make the p-type contact, a p-type Si NM was transfer-printed onto a p-type GaN contact layer onto which a thin film of hafnium oxide ($HfO_2$) had been deposited via ALD. The p-type Si NM functioned as a hole injector due to its higher activated carrier levels, as compared to the p-type GaN, leading to the improved peak efficiency and droop rates of the LEDs. The band alignment of the isotype heterointerfaces in the multilayered-type contact was determined using X-ray photoelectron spectroscopy (XPS), which analyzed the surface and interface potential changes of Si NM and GaN. The ultrathin atomic-layer deposition (ALD) interface layer provided a current tunneling layer and improved the surface condition of GaN for transfer printing. The peak values of wall-plug efficiency (WPE), efficacy, and external-quantum efficiency (EQE) of the Si NM/GaN LEDs were improved by 10%, 18%, and 14%, respectively, and the droop rates of WPE, efficacy, and EQE were decreased by 16%, 16%, and 19%, individually, as compared to the GaN LEDs without the multilayered Si NM/$HfO_2$/p-GaN p-type contacts. The increased carrier concentration in the MQW enhanced the uniformity in distribution of carrier wave functions with band-filling and internal polarization screening effects. The effects of reduced electron leakage by the increased hole injection and enhanced thermal dissipation from the Si NM/$HfO_2$/p-GaN heterointerfaces overcame the effect of Auger recombination and improved the efficiency droop in the InGaN/GaN LEDs.

Results and Discussion

Structural Property of LEDs with Isotype Heterointerfaces

The process steps for fabricating the InGaN/GaN LEDs with the Si NM/GaN isotype heterointerfaces began with boron ion implantation into the silicon device layer of an of Si-on-insulator (SOI) wafer, followed by thinning down to a thickness of 50 nm. After the implantation and activation annealing, the doping concentration ($N_A$) on the top of the 50 nm Si NM was 8.8×10$^{19}$ cm$^{-3}$. Within 50 nm from the bottom of the Si NM, the $N_A$ values obtained by circular transmission line measurement and simulation overlapped. The Si can have a high boron dopant concentration due to the relatively low ionization energy of B in Si (45 meV), whereas the GaN has a high ionization energy of Mg (170 meV), making it difficult to achieve a high concentration. After an undercut step for removal of the sacrificial buried oxide layer, the doped Si NM was released from the handle substrate using a polydimethylsiloxane (PDMS) elastomeric stamp. Then the Si NM was laminated onto the InGaN/GaN LED epi-wafer by the transfer printing method. Prior to the transfer printing process, an ultrathin $HfO_2$ current tunneling layer was deposited using ALD on the top surface of the InGaN/GaN LED epi-wafer. The transfer-printed Si NM on the InGaN/GaN LED epi-wafer was then annealed to increase the bonding strength and reduce the defect states at the junction interfaces. The Si NM/$HfO_2$/p-GaN LEDs exhibit uniform blue light emission intensity without current crowing on the Si NM top surface. The sustainable crystalline quality was a significant criterion to assess the junction formation by means of the transfer-printing method. High-resolution X-ray diffractometer (HRXRD) analysis and Raman spectroscopy were applied to evaluate this criterion for the Si NM/GaN heterointerfaces. The XRD scan as a function of 2θ exhibited main peaks at 34.7° and 69.2°, which originated from the GaN (002) epi-layer and transferred Si NM (100), respectively. The 2θ value for Si NM indicated single crystalline quality with no strain after the transfer-printing and junction bonding steps. The small peak shift of GaN epi-layer compared to the unstrained bulk GaN (34.5°) was ascribed to the induced piezo-strain attributed to the lattice mismatch between the GaN and InGaN during epi-growth on patterned sapphire substrates (PSS). The Raman spectrum as a function of Raman shift displayed two main peaks at 519.2 $cm^{-1}$ and 570.7 $cm^{-1}$, corresponding to the transferred Si NM (100) and GaN (002) epi-layer, individually. The Raman shift for the Si NM confirmed that there was almost no strain inside the Si NM after junction formation of heterointerfaces. The Raman peak shift across the GaN layer was 3.1 $cm^1$, as compared to the unstrained GaN at 567.6 $cm^1$. This was due to the strain originating from the InGaN/GaN multi-layer epi-growth. Considering the achievable high doping/carrier concentration and the transmittance/absorbance/reflectance of the wavelength of blue light from the GaN LEDs, the thickness of the Si NM was determined to be 50 nm for the formation of isotype heterointerfaces. The transmittance (T) of the Si NM (50 nm) and Ni/Au current spreading layer (CSL) were about 80% and 75%, respectively, at a wavelength of 443 nm. The fabrication procedure of Si NM/GaN LEDs continued with the formation of cathode electrodes, a CSL, anode electrodes, and interconnections.

Band Alignment of the Si NM/GaN Isotype Heterointerfaces

Figure 8B:
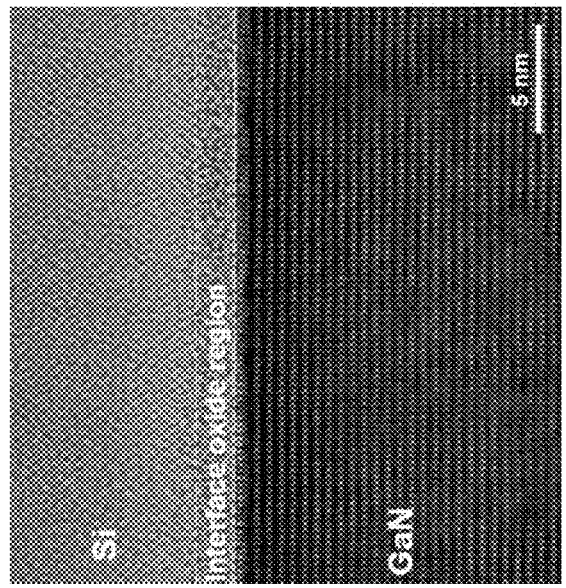
FIG. 8B shows a high-resolution transmission electron microscope (HRTEM) image of Si NM/GaN heterointerfaces.
Figure 8A:
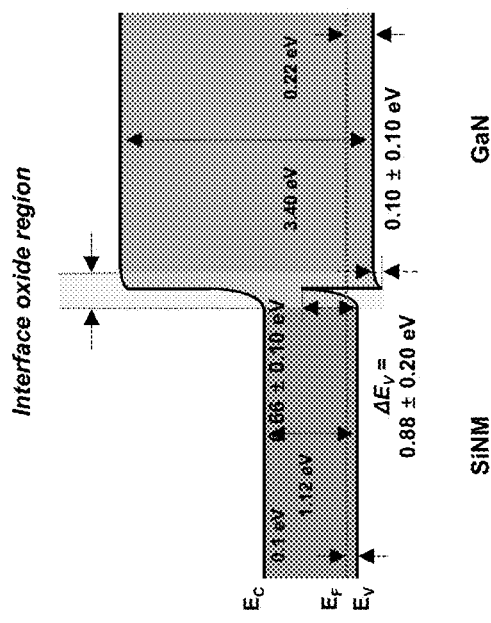
FIG. 8A shows band alignment of an Si NM/GaN isotype heterointerface in thermal equilibrium, determined by XPS measurements.
Figure 8C:
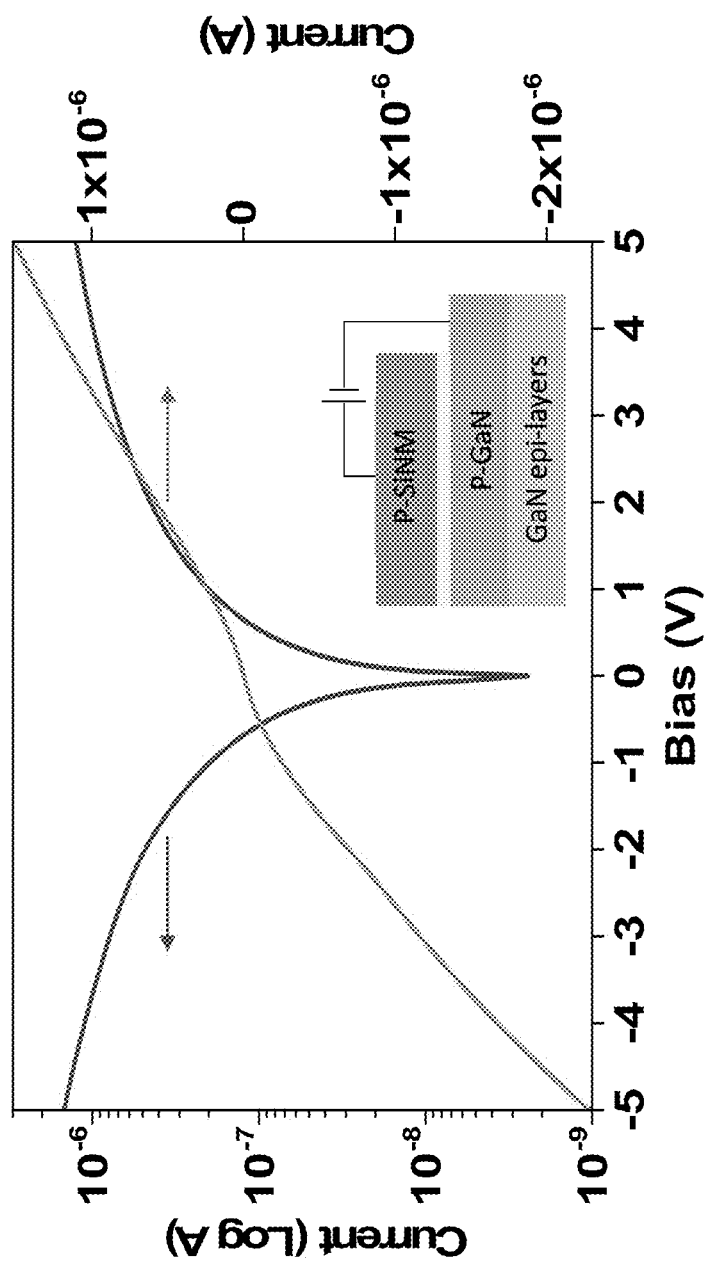
FIG. 8C shows the ohmic-like I-V characteristics of the Si NM/GaN isotype heterointerfaces.

When the contact heterointerface was formed, the hole carriers in the Si NM hole injection layer could diffuse into the p-type GaN contact layer and be injected into the active region of the GaN LEDs under a forward bias, which overcame the limited hole concentration of the p-GaN and improved the radiative efficiency of the LEDs. The band alignment of the Si NM/$HfO_2$/p-GaN isotype heterointerfaces was determined using X-ray photoelectron spectroscopy (XPS) measurements. In order to elucidate the phenomena at the interfaces, the atomic binding energies of Si 2p for Si NM and Ga 3d for GaN (p-GaN layer of LED wafer) were measured on the surfaces and interfaces of the Si NM/$HfO_2$/p-GaN heterointerfaces. XPS spectra for the near-valence band maximum (VBM) regions of Si NM and GaN surfaces were obtained. The VBM was determined by linear extrapolation of the valence band edge to zero intensity. The VBM values of Si NM and GaN were 0.1±0.10 eV and 0.22±0.10 eV, respectively. To calculate the band bending of Si NM and GaN at the heterointerfaces, the binding energies of Si 2p and Ga 3d were first measured on the bulk surfaces. Then, the binding energies of Si 2p and Ga 3d were measured at the heterointerfaces after thinning down the Si NM to ~10 nm. Since XPS can detect the photoelectrons escaping from ~15 nm deep from the surface, the binding energy of both Si 2p and Ga 3d at the interfaces can be measured with the thinned down heterostructures. For the composition analysis, the Si 2p spectra were divided into Si bonded to Si (Si—Si) and Si bonded to O (Si—O), while the Ga 3d spectra were divided into Ga bonded to N (Ga—N) and Ga bonded to O (Ga—O). The Hf 4f spectrum was detected with the Ga 3d spectrum at the interface. From the comparison of Si 2p spectra obtained on the top surface and at the interface, the ratio of Si—O/Si—Si increased from 12.71 to 42.23 and the peak binding energy shifted from 100.09 eV to 99.43 eV, indicating that the Si NM was more oxidized at the interface with a surface potential of 0.66±0.10 eV (upward band bending). From the comparison of Ga 3d spectra, the ratio of Ga—O/Ga—N also increased from 18.89 to 37.31 and the peak binding energy shifted from 18.97 eV to 19.07 eV, meaning that GaN was also oxidized at the interface with a surface potential of (−) 0.10±0.10 eV (downward band bending). The band alignment of Si NM/$HfO_2$/p-GaN heterointerfaces in the thermal equilibrium is shown in FIG. 8A, which shows that the Fermi levels of Si NM and GaN are first aligned, and individual Si NM and GaN show their own surface potentials at the interface. The valence band offset ($\Delta E_V$) is defined as $\Delta E_V = [E_{CL}^{GaN} - E_V^{GaN}]_b - [E_{CL}^{Al_2O_3} - E_V^{Al_2O_3}]_b - [E_{CL}^{GaN} - E_V^{Al_2O_3}]_i$, where $E_{CL}$ is the binding energy of the core level, $E_V$ is the VMB value, and subscripts b and i indicate the bulk and interface, individually. As a result, the $\Delta E_V$ of Si NM/GaN heterointerfaces was estimated to be 0.88±0.20 eV, which is smaller than the band offset of the band alignment from Anderson's model (~2.23 eV). The reduced valence band offset is attributed to the formation of the interface oxide region ($SiO_2 + HfO_2 + Ga_2O_3$) during the junction bonding step, which enhances the hole injection from the Si NM to GaN through the interface region under the forward bias. An atomic-level image of the Si NM/$HfO_2$/p-GaN heterointerface captured by a high-resolution transmission electron microscope (HRTEM) confirmed the crystalline properties of Si NM and GaN, in addition to the formation of an interface oxide region (FIG. 8B). The current-voltage (I-V) characteristics of the isotype heterojunction are shown in FIG. 8C, representing ohmic-like behavior due to the merit (i.e., reduced $\Delta E_V$) of the heterointerfaces. The parameters for band alignment of the Si NM/GaN heterointerfaces are summarized in Table 1.

TABLE 1

Summary of band alignment of Si NM/GaN heterointerfaces

| Heterointerface | Ratio (%) | | Binding energy (eV) | | | Surface potential at interface (eV) |
|---|---|---|---|---|---|---|
| | Si—O/Si—Si | Ga—O/Ga—N | Si 2p | Ga 3d | VBM ($E_F$) | |
| Si NM surface | 12.71 | | 100.09 | | 0.10 ± 0.10 | 0.66 ± 0.10 eV |
| Si NM interface | 42.23 | | 99.43 | | | |
| GaN surface | | 18.89 | | 18.97 | 0.22 ± 0.10 | (−) 0.10 ± 0.10 eV |
| GaN interface | | 37.31 | | 19.07 | | |

Electrical characteristics of Si NM/GaN LEDs

Figure 10B:
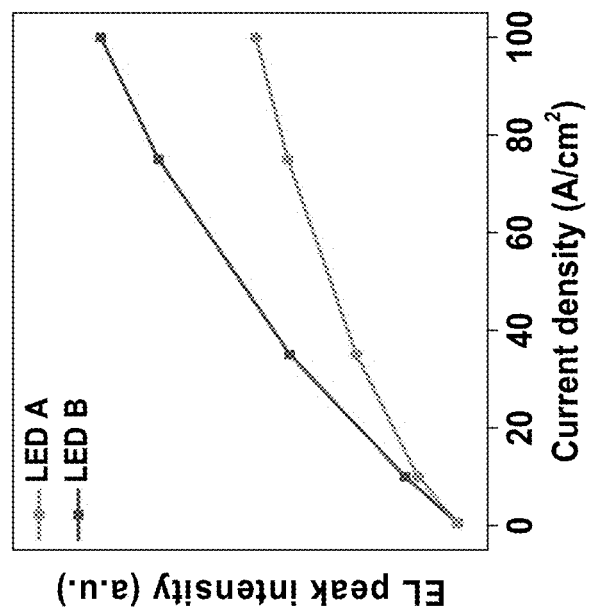
FIG. 10B shows that the electroluminescence (EL) peak intensity of LED B is higher than that of LED A at every driving current density.
Figure 10A:
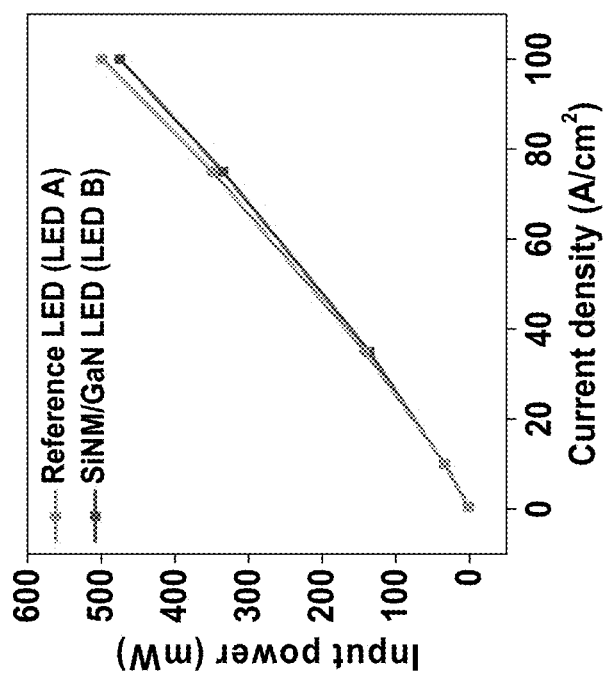
FIG. 10A shows the input power characteristics of LEDs A and B.
Figure 10E:
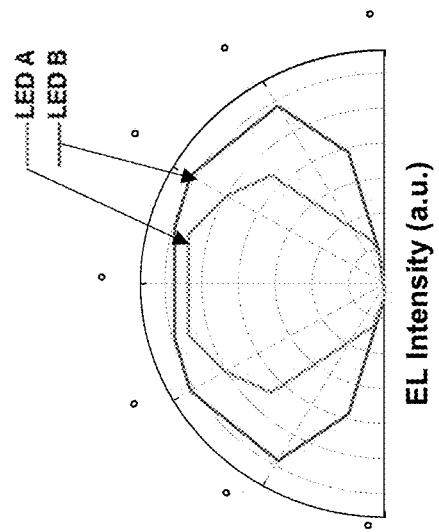
FIG. 10E shows that the angle-dependent EL emission intensity examined by far-field measurement taken from 0° (normal) to 90° (horizontal) with a 15° interval at a current density of 100 A/cm$^2$.
Figure 10D:
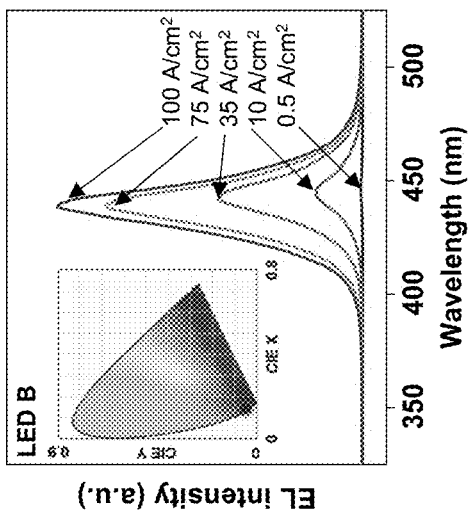
FIG. 10D shows the EL spectra of LED B as driving current density increased from 0.5 to 100 A/cm$^2$. The chromaticity coordinates of the EL spectra of the LEDs are plotted within the adjacent blue area of the CIE 1931 diagram in the insets of FIGS. 10C and 10D, respectively.
Figure 10C:
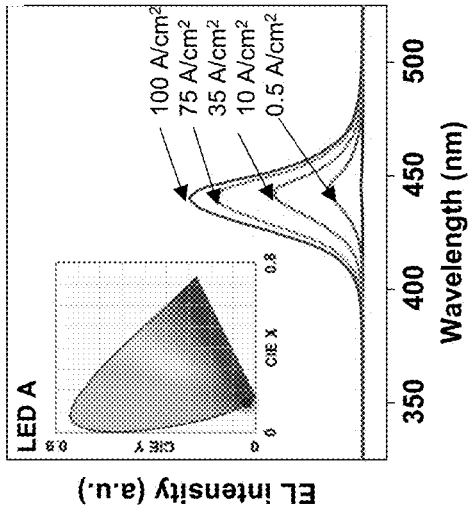
FIG. 10C shows the EL spectra of LED A as driving current density increased from 0.5 to 100 A/cm$^2$.
Figure 10H:
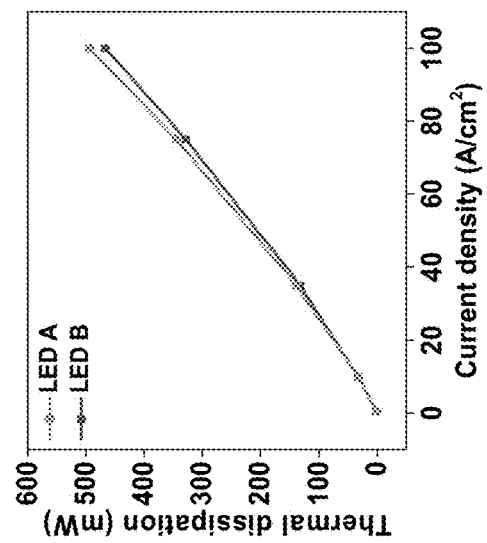
FIG. 10H shows the thermal dissipation as a function of current density of LEDs A and B.
Figure 10G:
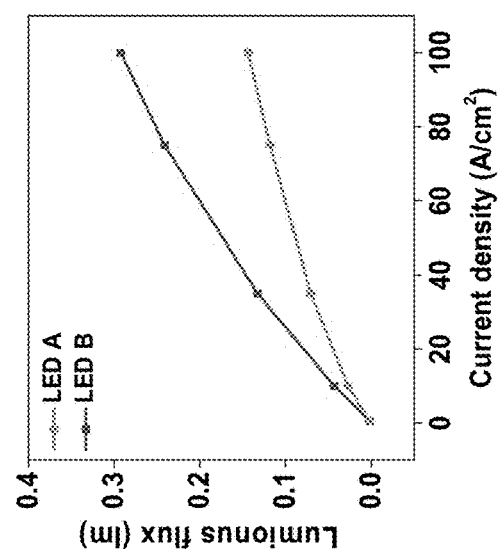
FIG. 10G shows the luminous flux as a function of current density for LEDs A and B.
Figure 10F:
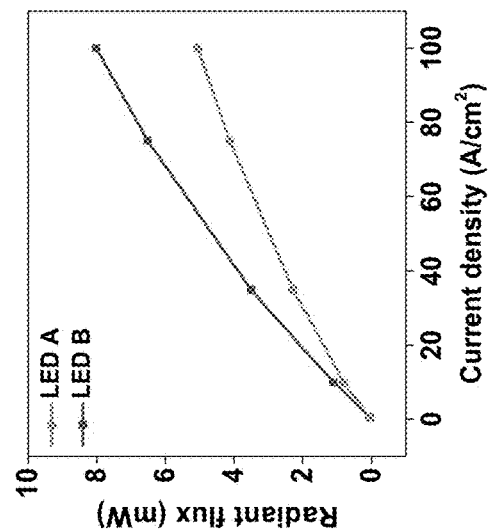
FIG. 10F shows the radiant flux as a function of current density for LEDs A and B.

In order to confirm the improved performance of the GaN LEDs with the Si NM/HfO$_2$/p-GaN heterointerfaces, the electrical characteristics of reference GaN LEDs (LED A, ibid.) and the Si NM/HfO$_2$/p-GaN LEDs (LED B, ibid.) were investigated. The vertical structure of the Si NM/GaN LEDs provides the increased hole injection from the Si NM to GaN:Mg under forward bias, in which more holes can flow into the MQW for radiative electron-hole pair (EHP) recombination. Typically, the efficiency for the EHP recombination in the MQW of III-nitride LED is highly dependent on the total number of holes injected into the active area and recombined with the electrons injected from the n-type nitride material. This is because of the low hole injection rate of the p-type nitride material with inefficient activation of carriers. With the Si NM/HfO$_2$/p-GaN p-type contacts for the GaN LEDs, the accumulated holes in the valence band of Si NM were easily injected into the valence band of the GaN layer by tunneling through the interface oxide region under the forward bias and thereby increased the hole concentration in the MQW and the radiative recombination rate. FIG. 10A shows the input power characteristics of LEDs A and B, in which the lower input power of LED B relative to LED A is attributed to the increased carrier injection. The electroluminescence (EL) peak intensity of LED B is higher than that of LED A at every driving current density (FIG. 10B). The higher intensity of LEDs with the Si NM/GaN p-type contacts is attributed to the increased EHP recombination rates in the MQW, owing to the increased hole injection from the Si NM hole injectors. In detail, the EL spectra of LEDs A and B are exhibited in FIGS. 10C and 10D, respectively, as driving current density increased from 0.5 to 100 A/cm$^2$, and the chromaticity coordinates of the EL spectra of the LEDs are plotted within the adjacent blue area of the CIE 1931 diagram in the insets of FIGS. 10C and 10D, respectively. The angle-dependent EL emission intensity was examined by far-field measurement taken from 0° (normal) to 90° (horizontal) with a 15° interval at a current density of 100 A/cm$^2$, as shown in FIG. 10E. The far-field radiant pattern of LED B exhibited a stronger emission intensity than that of LED A at every detection point due to the enhanced radiative EHP recombination rate from the increased hole injection from the heterointerfaces. In order to investigate the effect of isotype heterointerfaces on the enhancement in light output power of the GaN LEDs, the radiant flux and luminous flux were inspected as a function of current density. The radiant flux revealed that the optical output power of LED B was improved by 59% as compared to LED A at a current density of 100 A/cm$^2$ (FIG. 10F). Also, the luminous flux as a function of current density exhibits an improved output power of LED B by 104% as compared to LED A at the same driving current density (FIG. 10G). In addition, the higher slopes of the radiant flux and luminous flux with increasing driving current density are attributed to the reduced self-heating effect, as compared to the slope of reference LEDs, because of the enhanced thermal transfer ability of LED B with the Si NM/HfO$_2$/p-GaN p-type contacts. Indeed, the Si NM with higher thermal conductivity (~150 Wm$^{-1}$K$^{-1}$) than GaN (~130 Wm$^{-1}$K$^{-1}$) works as a heat sink for the LEDs. Considering the structure of LED B, in which the Si NM covered whole top surface, the heating generated at high current level could be transferred to the top Si NM more effectively. FIG. 10H confirms the improved thermal dissipation ability of LED B, in which the amount of thermal dissipation of LED B was smaller than the LED A during the operation and the difference between the LEDs increased as driving current density increased. This indicates that the junction temperature of LED B was lower than that of LED A, and the temperature difference between the LEDs increased as the driving current density increased. Since the higher junction temperature reduced the light output power due to the increased non-radiative recombination, the efficiency droop rate of LED B was smaller than the LEDs as the driving current level increases, indicating a reduced efficiency droop rate of LED B at higher current density.

Phenomena in the MQWs with Increased Carrier Injection

The increase in the number of emitted photons from LED B is proof of the increased hole concentration in the MQW active region, with the assumption that the radiative recombination coefficient in the MQW active region is the same for both LEDs A and B because of the identical epi-growth structures. The number of emitted photons and injected electrons of LEDs A and B are shown in FIG. 11A. The number of injected electrons for both LEDs was equal because they have the same driving current density, whereas the number of emitted photons is different according to the types of LEDs. Since the number of injected electrons was larger than the number of injected holes, the number of emitted photons and magnitude of light output power can be determined by the total number of holes injected into the MQW and recombined with the electrons for the radiative recombination. Thus, it can be deduced from the increased number of emitted photons of LED B with respect to that of LED A that the hole concentration in the MQW of LED B increased due to the improved hole injection from the Si NM/HfO$_2$/p-GaN p-type contact. Individual QWs next to the p-GaN/EBL of LEDs A and B are depicted in FIGS. 11B and 11C, respectively. In LED A, the holes injected into the valence band are normally positioned in the low energy region of the MQW and recombined with the electrons in the conduction band, resulting in the radiative recombination of EHPs with a photon energy of hv$_1$ (FIG. 11B), where h is the Planck's constant and v$_1$ is the frequency of light. In the case of LED B, with the increased hole injection rate, the increased hole concentration was formed in both low and high energy regions of the MQW (i.e., band-filling effect), leading to the radiative recombination of EHPs with a higher photon energy of $hv_2$ ($v_1 < v_2$, where the $v_2$ is the frequency of light with the band-filling effect in the MQW) (FIG. 11C). The band-filling effect of increased hole concentration induced the blue-shift of the peak wavelength of light. The increased carrier concentration in the MQW by the increased hole concentration in the MQW also screened an internal polarization field ($P_{SP}$), as shown in FIG. 11D. The black dotted and solid lines represent the energy bands of QWs for LEDs A and B, separately. As shown in LED A with a photon energy of $hv_A$, where the $v_A$ is the frequency of light, the polarization field tilted the slope of the MQW and separated the overlap positions of the electron and hole wave functions in the conduction and valence bands ($\Psi_e$ and $\Psi_h$), resulting in the reduced light-emission efficiency of LEDs (i.e., quantum-confined Stark effect (QCSE)).

With the higher hole injection rate of LED B, the increased hole concentration in the valence band enhanced the electric field formed with the electrons in the conduction band, which led to the screening of the internal polarization field in the MQW. The reduced polarization field ($P'_{SP}$) resulted in flattened slopes of the valence and conduction bands of the MQW and an increased overlap area between the carrier wave functions (i.e., suppression of QCSE). The suppressed QCSE improved the radiative recombination efficiency with the increased photon energy of $hv_B$ ($v_A < v_B$, where the $v_B$ e s the frequency of light with the screening effect of increased hole concentration in the MQW). FIG. 11E depicts the energy band diagrams of LEDs A and B and considers the band-filling and internal polarization screening effects of increased hole concentration formed by the isotype heterointerfaces. In LED B, the improvement in the hole injection was more prominent in the QW close to the p-GaN/EBL side, so the band-filling and screening effects were also stronger in the QW nearby the p-type side, resulting in an enhanced photon energy in the MQW as $hv_{A1} < hv_{B2}$, where $v_{A1}$ and $v_{B2}$ are the frequency of light with weak and strong band-filling and screening effects of increased hole concentration in the MQW, respectively. The EL peak wavelength shift of LEDs A and B as a function of driving current density is plotted in FIG. 11F, in which the blue-shift of the wavelength is associated with the band-filling and screening effects by the injected carriers into the MQW. Specifically, the peak wavelength of LEDs A and B at a current density of 0.5 A/cm² were 446.5 nm and 446.6 nm, and 439.8 nm and 438.6 nm, at a current density of 100 A/cm², respectively. The more blue-shifted peak wavelength of LED B ($\Delta\lambda_{LED\ B}$) over LED A ($\Delta\lambda_{LED\ A}$), with increasing driving current density, indicates the increased band-filling and screening effects in the MQW by the increased hole carrier concentration. The ideal energy band diagram of a single QW in LED B is represented in FIG. 11G with the flat valence and conductions bands, the overlapped carrier wave function profiles, and a photon energy of $hv_{B2}$. The electron leakage is the flow of electrons over the active region to recombine with holes in the p-type GaN, causing efficiency droop. The increased hole concentration in the QW enhances the radiative recombination efficiency and thus reduces the amount of electron leakage, resulting in improved efficiency droop in the LEDs.

Improved Efficiency of Si NM/GaN LEDs

Figure 12A:
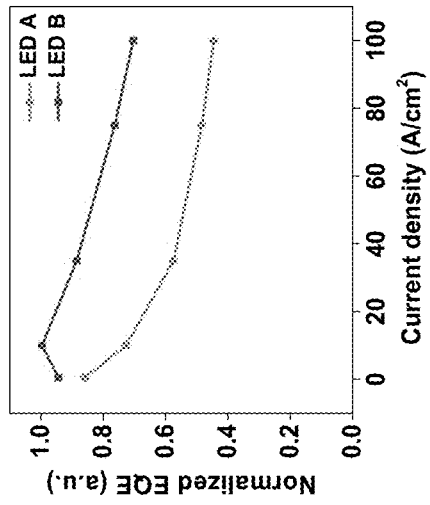
FIGS. 12A-12E show the improved efficiency of Si NM/GaN LEDs. Si NM/GaN LEDs for efficiency measurement (all bare chips: no light extraction fixture was used).
Figure 12B:
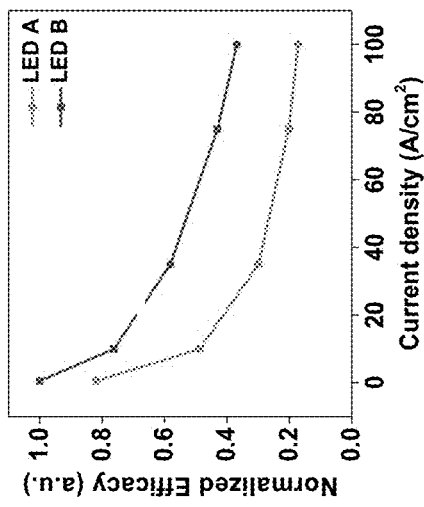
Figure 12E:
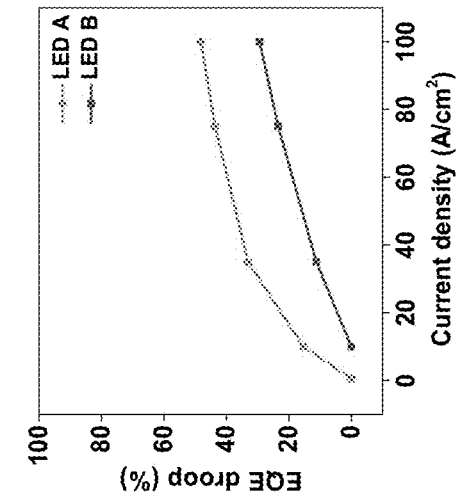
Figure 12D:
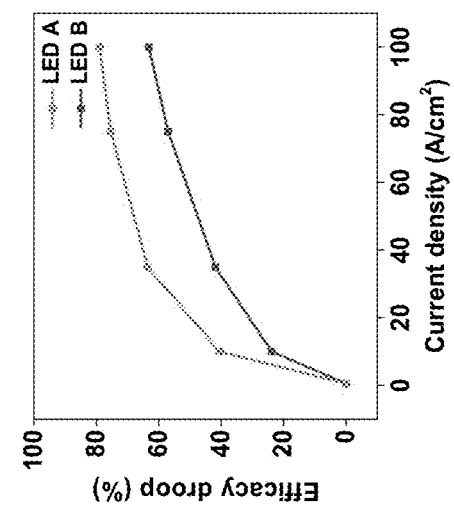
Figure 12C:
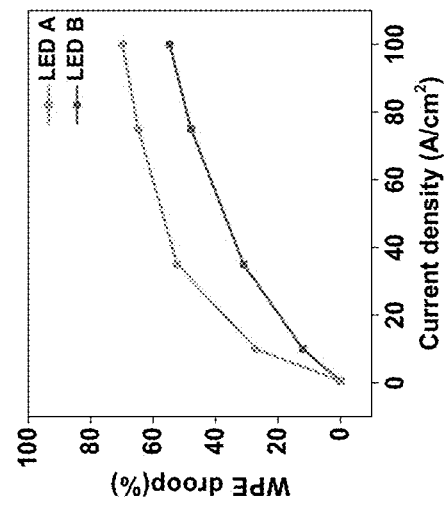

The LEDs were measured in a calibrated integrating sphere after wire-bonding on the socket (all bare chips: no light extraction or additional thermal management fixtures were used). In order to assess the effects of the isotype heterointerfaces on the enhancement of the efficiency droop in the GaN LEDs, the wall-plug efficiency (WPE), efficacy, and external quantum efficiency (EQE) were obtained and the corresponding droop rates were estimated. The efficiencies are defined as follows: WPE is the ratio of the radiant flux to the input power, efficacy is the ratio of the luminous flux to the input power, and EQE is the ratio of the number of emitted photons to the number of injected charge carriers. For normalized WPE shown in FIG. 12A, the efficiency for LEDs A and B reached peak values at 0.5 A/cm², and then decreased with increased current density, exhibiting efficiency droop behavior. The peak efficiency of LED B improved by 10% as compared to LED A. The WPE droop rate in FIG. 12C shows that the droop rates of LED B improved by 16% at 100 A/cm², as compared to LED A. The normalized efficacy of LEDs A and B in FIG. 12B also shows that the peak values of the efficiency occurred at 0.5 A/cm², with an improvement ratio of 18%. The efficacy droop rates of LED B improved by 22% at 35 A/cm² and 16% at 100 A/cm² as compared to LED A, shown in FIG. 12D. The normalized EQE of LEDs A and B reached peak efficiency values at 0.5 A/cm² and 10 A/cm², respectively, and both LEDs revealed efficiency droop behavior as the current density increased, as shown in FIG. 12B. The EQE peak efficiency of LED B increased by 14% and the droop rate of LED B improved by 19% at 100 A/cm² as compared to LED A, as shown in FIG. 12E. The improved peak efficiency of LED B is attributed to the increased radiative recombination rate in the MQW with the increased hole injection rate of the Si NM/HfO₂/p-GaN heterointerfaces. The improvement in the symmetry of electron and hole concentrations in the MQW by the increased hole injection rates generated more EHPs for radiative recombination. The improved droop rate of LED B can be explained by compensation for the effect of Auger recombination. The Auger process involves three carriers, in which the third-carrier is excited by the energy released from the other two carriers' recombination as non-radiative process, leading to the efficiency droop as the driving current density increases. From the structural properties of the LEDs with Si NM/HfO₂/p-GaN p-type contacts, the outcome of the Auger process was compensated by the effects of reduced electron leakage and enhanced thermal dissipation on the efficiency droop. The improved radiative recombination rate by the increased hole injection reduced the electron leakage and the enhanced thermal ability lowered the junction temperature, thereby overcoming the effect of Auger recombination and improving the efficiency droop rates of LEDs.

Effect of Light Extraction on Efficiency of LEDs

Figure 13B:
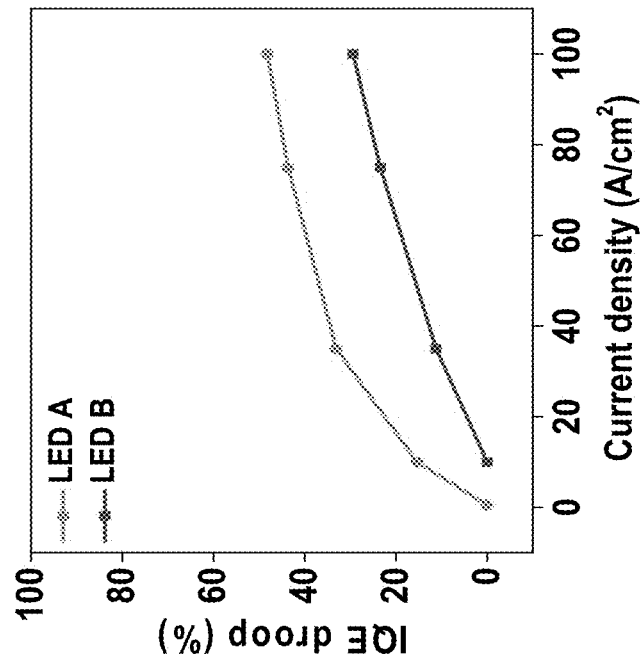
FIG. 13B shows the IQE droop for LEDs A and B.
Figure 13A:
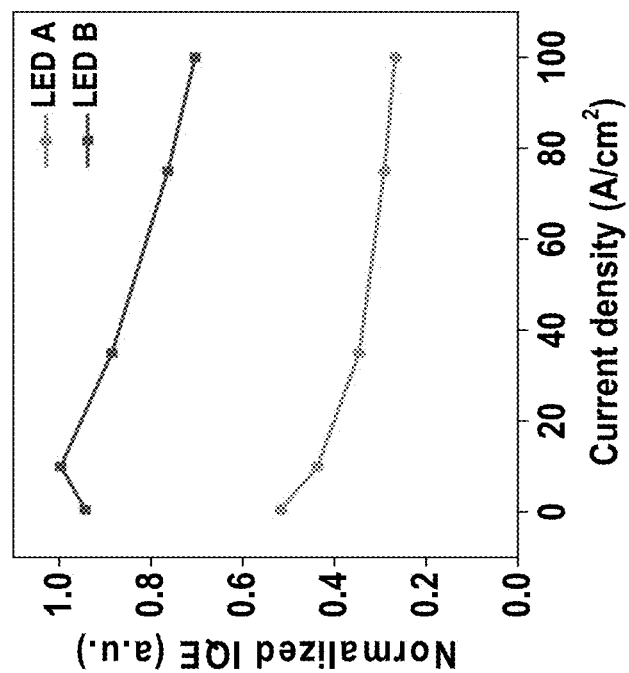
FIG. 13A shows the normalized IQE for LEDs A and B.

The effect of light extraction on the efficiency of the GaN LEDs was further investigated by considering the absorption of light in the Si NM and top electrodes. The light extraction efficiency (LEE) for LEDs A and B was estimated using a finite-difference time-domain (FDTD) method with the consideration of top, bottom, and side-propagating light-emission. The LEEs of LEDs A and B were estimated to be 25% and 15%, respectively, in which more light was absorbed by the formation of the Si NM/HfO₂/p-GaN p-type contacts. From the LEE values, the internal quantum efficiency (IQE) was calculated using the relationship of IQE=EQE/LEE. Since IQE is defined as the ratio of the total emitted photons from the MQW to the number of injected carriers in the MQW, it can directly demonstrate the effect of increased hole injection on the radiative recombination efficiency of the LEDs. Like the trend of EQE, the IQE of LEDs A and B reached peak values at 0.5 A/cm² and 10 A/cm², individually, and then revealed drooping behavior as the current density increased, as shown in FIGS. 13A and 13B. The IQE peak efficiency and droop rates of LED B improved by 48% and 19%, respectively, compared to LED A, due to the increased hole injection, reduced electron leakage, and enhanced thermal dissipation of the LEDs with the Si NM/HfO$_2$/p-GaN p-type contacts.

Figures 13C, 13D:
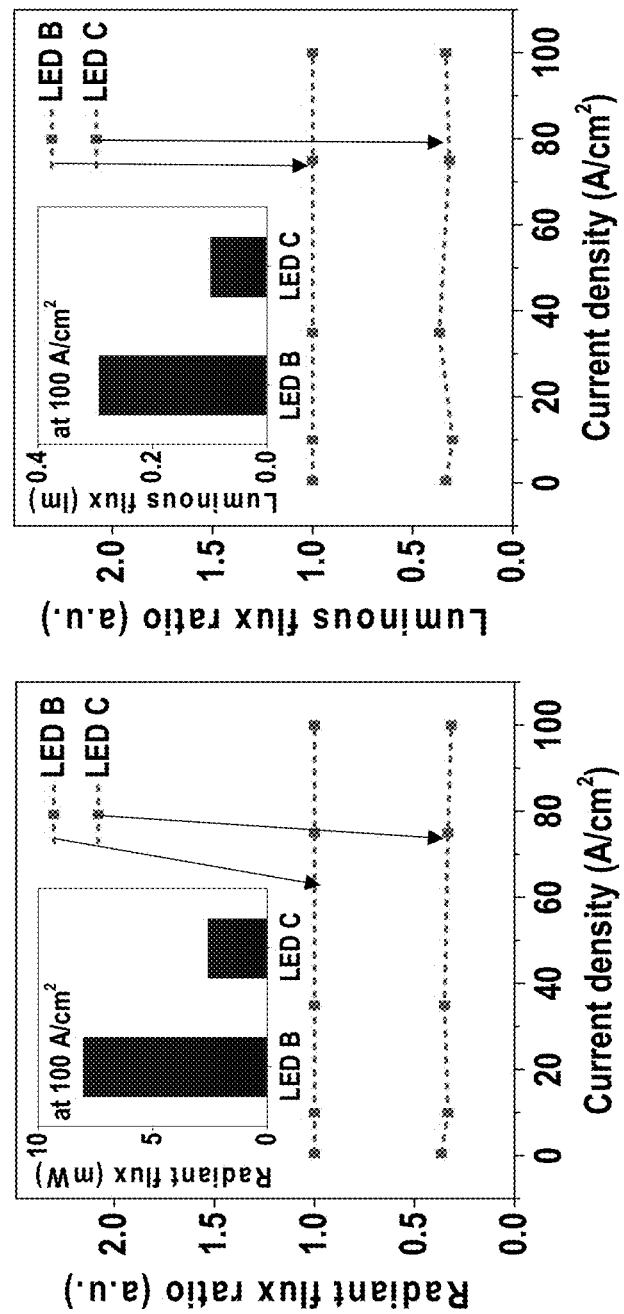
FIG. 13C shows the radiant flux for LEDs B and C.
FIG. 13D shows the luminous flux for LEDs B and C.
Figures 13E, 13F, 13G:
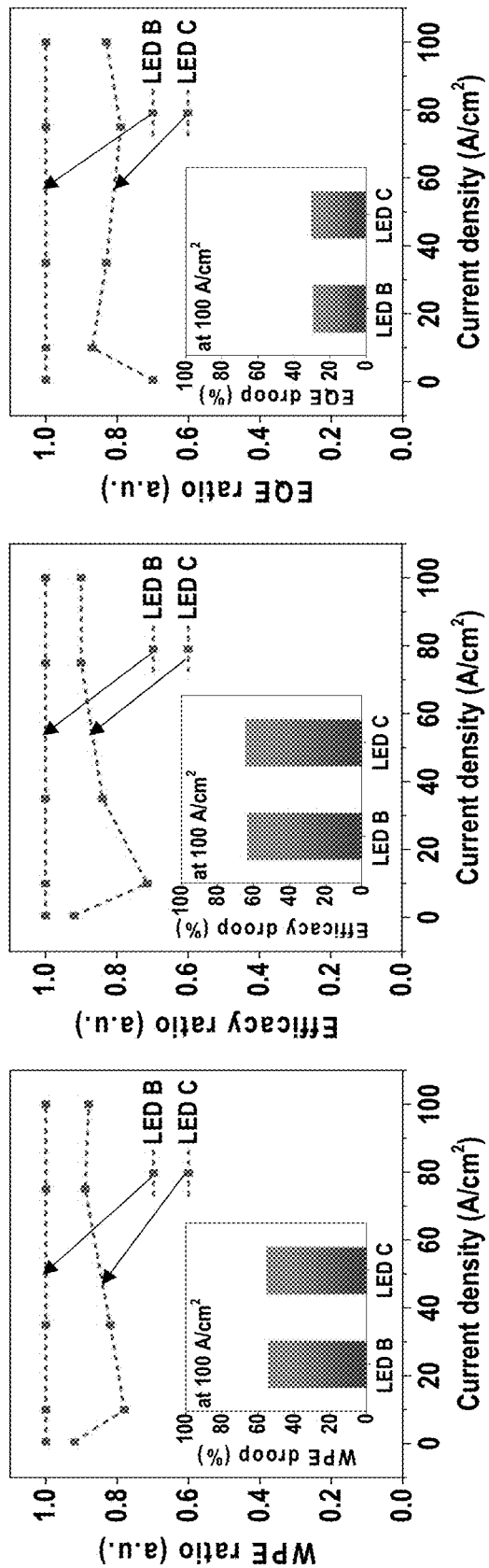
FIG. 13E shows the WPE ratio for LEDs B and C.
FIG. 13F shows the efficacy ratio for LEDs B and C.
FIG. 13G shows the EQE ratio for LEDs B and C.

To achieve a high efficiency, the bare chips were packaged with other elements such as electrodes, lenses, and color-modulating materials. Among them, the electrodes decreased the performance of the LEDs by absorbing the emitted light; however, the minimum dimensions of the electrodes were restricted by subsequent processes such as interconnection and wire-bonding. The effect of the top, light-absorbing electrodes on the efficiency droop in the GaN LEDs was examined by comparing the performance ratio of Si NM/GaN LED B (hole injection area: 0.0018 cm$^2$) to the smaller Si NM/GaN LEDs (hole injection area: 0.006 cm$^2$, LED C). The ratios of the anode (width: 10 μm) to Si NM for LEDs B and C were 17% and 26%, respectively. The output power and efficiency of LED B were set at 1.0 at each input current density for ratio comparison. The radiant flux and luminous flux properties of LEDs B and C in FIGS. 13C and 13D showed that the radiant fluxes at a current density of 100 A/cm$^2$ were 8.02 mW and 2.54 mW, and the luminous fluxes at a current density of 100 A/cm$^2$ were 0.29 lm and 0.097 lm, respectively. The ratio of the output powers of LEDs B and C was larger than the ratio of the hole injection area, implying that loss of light was more prevalent in smaller LED C. Furthermore, the droop rates of WPE, efficacy, and EQE for LEDs B and C are examined in FIGS. 13E-13G, in which the droop rates of LEDs B and C at 100 A/cm$^2$ were 54% and 56% for WPE; 63% and 64% for efficacy; and 29% and 32% for EQE, individually. The droop rates of LEDs B and C at 35 A/cm$^2$ were 41% and 46% for efficacy. The higher efficiency droop rate of LED C as compared to LED B is possibly due to the large ratio of electrodes to hole injection area, which makes it possible to absorb more photons and disturb radiative recombination efficiency. Nevertheless, the efficiency droop rates of the LEDs with Si NM/HfO$_2$/p-GaN p-type contacts were further improved as compared to the LEDs without such contacts, regardless of the ratio of electrodes to hole injection area. The improved efficiency droop rates of LEDs A, B, and C are summarized in Table 2.

TABLE 2

Summary of improved efficiency droop rates

| Droop at 100 A/cm$^2$ (%) | WPE | Efficacy (at 35 A/cm$^2$) | EQE |
|---|---|---|---|
| LED A | 70 | 79 (63) | 48 |
| LED B | 54 | 63 (41) | 29 |
| LED C | 56 | 64 (46) | 32 |
| Improved droop rate (%) | 16 | 16 (22) | 19 |

Methods

Materials Preparation.

The InGaN/GaN LED epi-wafers were grown on the (0001)-plane of PSS by metal organic chemical vapor deposition. A GaN buffer layer was grown first and a 600 nm Si-doped GaN layer was grown with a doping concentration of $1 \times 10^{19}$ cm$^{-3}$. Then, 350 nm of unintentionally-doped GaN grading and 150 nm of pre-strained InGaN layers were grown, which was followed by the growth of eight periods of In$_{0.2}$Ga$_{0.8}$N/GaN MQW with a quantum well/barrier thickness of ⅜ nm and a 20 nm EBL. Lastly, a 50 nm thick Mg-doped GaN p-type layer was grown with a doping concentration of $5 \times 10^9$ cm$^{-3}$. The epi-wafers were treated with wet chemical cleaning steps using RCA cleaning. The 0.5 nm HfO$_2$ was deposited on the as-cleaned GaN LED epi-wafers in the Ultratech/Cambridge Nanotech Savannah S200 ALD system integrated with the nitrogen filled glove box. 99.99% pure TDMAH (Sigma-Aldrich Co.) and high purity H$_2$O with 18 MΩ (The Science Company) were used as ALD precursors.

Si NM Transfer-Printing.

The p-SOI (Si/box=205/400 nm) wafer with a doping concentration of $9 \times 10^{14}$ cm$^{13}$ was first oxidized in the MRL tube at 1050° C. to grow a surface oxide layer for ion implantation. Then, the p-SOI was ion-implanted with B dopant at 15 keV energy, $3 \times 10^{15}$ cm$^{-2}$ dose, and 7-degree tilt, and then annealed at 1050° C. for ion activation. The doping concentration of the top 180 nm Si layer of ion-implanted SOI wafer was $1.56 \times 10^{20}$ cm$^{-3}$. For the Si NM fabrication, the top Si surface was oxidized by dry oxidation in the MRL tube until only the 50 nm thick Si layer remained. The surface oxide was removed in the buffered oxide etchant with 6:1 volume ratio of 40% NH$_4$F in water to 49% HF in water. The top doping concentration of the 50 nm Si layer was $8.8 \times 10^{19}$ cm$^{-3}$. The Si NM was patterned on the thinned down SOI wafer via the photolithography process. The diameter and periodicity of the etching holes on the Si NM were 4 μm and 50 μm, respectively. The undercut step (i.e., removal of box layer) was carried out by dipping the Si NM patterned SOI wafer into 1:1 H$_2$O diluted 49% HF solution. The released 50 nm Si NM was subsequently transfer printed onto the HfO$_2$-deposited GaN LED wafer using PDMS elastomeric stamp. The transferred NM was annealed at 600° C. to increase bonding strength and remove unexpected interface defect states.

Si Nm/Gan LED Fabrication.

On the Si NM/GaN LED and reference GaN LED wafers, the cathode mesa was patterned by the photolithography process and etched down to the n-GaN layer using inductively coupled plasma (ICP) with 10 sccm BCl$_3$, 16 sccm Cl$_2$, and 3 sccm Ar gases under the following conditions: 100 W ICP/500 W RF powers, 190 V DC voltage, and 4 mT pressure. Then, the cathode electrode was patterned within the mesa area and Ti/Al/Ti/Au (10/100/10/200 nm) was deposited for the cathode metal using e-beam evaporation, followed by ohmic annealing at 600° C. for 30s. The Ni/Au (5/5 nm) CSL was deposited on the top Si NM of the LEDs with heterointerfaces and p-GaN of the reference LEDs, and the anode electrode was patterned and deposited with Ni/Au (10/300 nm) as anode metal, followed by annealing at 600° C. for 30s. The LEDs were isolated using the ICP process. The fabricated LEDs went through the interconnection process with the plasma-enhanced chemical vapor deposition of the 600 nm SiO$_2$ layer, followed by deposition of Ti/Al/Ti/Au (20/1000/20/200 nm) interconnection electrodes. The LEDs were then mounted and Al wire-bonded on sockets for efficiency measurements in an integrating sphere.

XPS Measurement.

The binding energy levels of atomic elements were measured by XPS and analyzed using Thermo Fisher Scientific Avantage Software. The VBM of Si NM and GaN and core levels of Si 2p, Ga 3d, Hf 4f, N 1s, O 1s, and C 1s were measured to analyze surface and interface conditions of Si NM/GaN heterointerfaces. A monochromatic Al Kα X-ray source (hv=1486.60 eV) with a normal take-off angle was used. Each measurement was repeated 20 times with a step of 0.02 eV, spot size of 50 μm, pass energy of 50 eV, and dwell time of 50 ms with a 1.63 A filament current, 3.00 mA emission current, and 12 kV accelerating voltage. The XPS equipment was calibrated with the standard peak positions at 84.00 eV of Au $4f_{7/2}$, 368.20 eV of Ag $3d_{5/2}$, and 933.00 eV of Cu $2p_{3/2}$. The C 1s peak at 284.80 eV was referenced to offset the binding energy shift induced by surface charges. The uncertainty of core level centers is ±0.015 eV.

Characterizations.

The vertical shape of the epi-wafer was scanned by a Zeiss LEO 1530 Gemini field-emission SEM. The transmittance of the thin layers was measured by a Perkin-Elmer Lambda 19 UV/VIS/NIR spectrophotometer. The binding energy of the atomic core levels was investigated by a Thermo Fisher Scientific K-Alpha+ XPS. The 3D morphology of material surfaces was analyzed using a Zygo New View interferometer. The surface roughness of wafers was characterized by a Bruker Multimode 8 atomic force microscope. The crystalline quality of the material was measured by a PANalytical X'Pert PRO MRD HRXRD, and the strain in the layers was measured by a Horiba Jobin Yvon Labram Aramis Raman. The atomic-level interface image was captured by a FEI Tecnai HRTEM. The I-V properties were measured by a Keithley 4200-SCS semiconductor parameter analyzer and the EL characteristics were obtained and analyzed by a Gamma Scientific GS-1290 spectroradiometer with a calibrated integrating sphere and a Keithley 2602B system source meter. The numerical simulation was performed with Lumerical FDTD solution. The measurements were made at room temperature.

Example 5: Ultraviolet Light-Emitting Diode

In this example, a 229 nm wavelength LED operating under continuous wave (CW) drive current is illustrated.

Figure 14B:
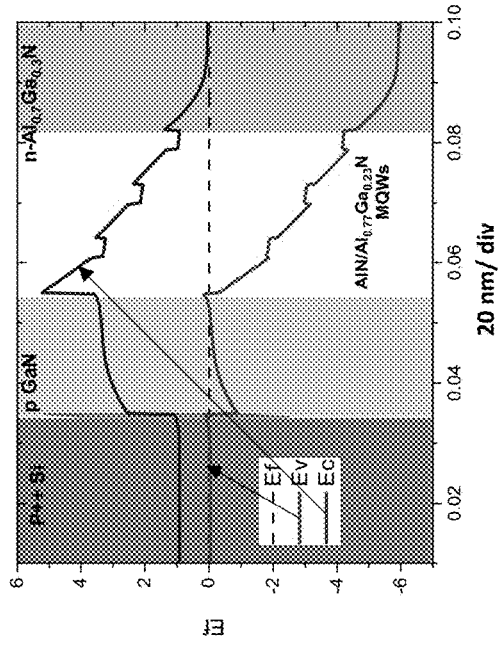
FIG. 14B is a band diagram of the entire LED structure consisting of p-Si, p-GaN, i-Al$_{0.77}$Ga$_{0.23}$N/AlN MQWs, and n-Al$_{0.7}$Ga$_{0.3}$N contact layer at equilibrium state.
Figure 14D:
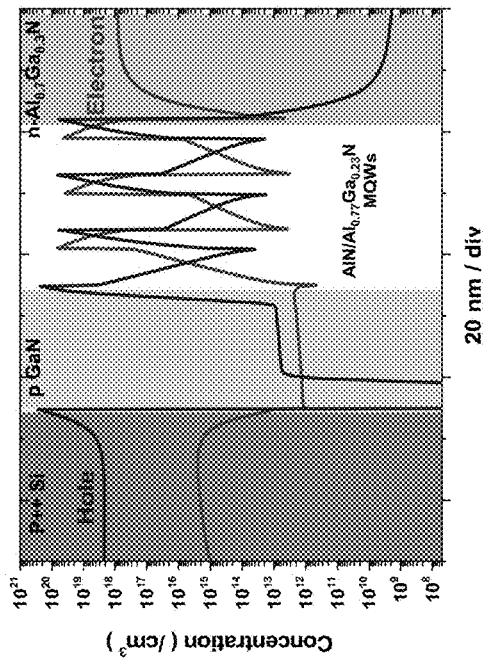
FIG. 14D depicts the carriers' concentration distribution across the LED structure under forward bias.
Figure 14A:
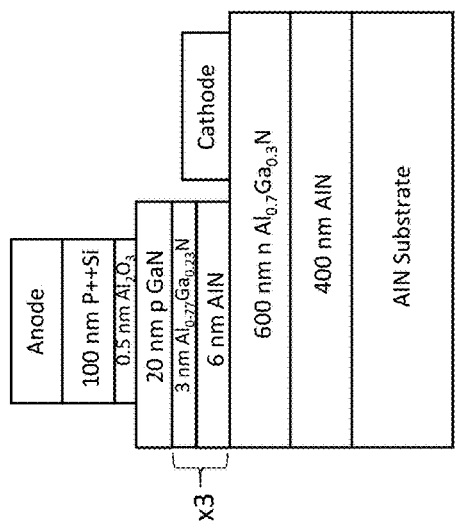
FIG. 14A is a schematic of an LED device structure.

The UV LED structure in FIG. 14A was grown on a bulk AlN substrate by low pressure organometallic vapor phase epitaxy (LP-OMVPE) in a custom high-temperature reactor. Following the growth of an initial 400 nm thick AlN homoepitaxial buffer layer on an AlN substrate, an Si-doped (concentration: $1 \times 10^{19}$ $cm^{-3}$) 600 nm thick n-$Al_{0.7}Ga_{0.3}N$ n-type contact layer and electron injection layer was grown prior to the growth of a 3-period ⅗ nm thick $Al_{0.77}Ga_{0.23}N$/AlN MQWs active region. The epitaxial growth was terminated with a 20 nm thick Mg doped (concentration: ~$4 \times 10^{19}$ $cm^{-3}$) p-GaN p-type layer to prevent rapid oxidation of the AlN surface. The dopant atomic concentration and free carrier concentration were characterized by secondary ion mass spectrometry (SIMS) and Hall Effect measurements, respectively. Prior to transferring a 100 nm thick, heavily doped single-crystal p-type Si NM hole injection layer with a dopant concentration of $5 \times 10^{19}$ $cm^{-3}$, a 0.5 nm thick $Al_2O_3$ layer, which acts as a current tunneling layer and a passivation layer, was deposited by five cycles of an atomic layer deposition (ALD) process using an Ultratech/Cambridge Nanotech Savannah S200 ALD system.

Figure 14C:
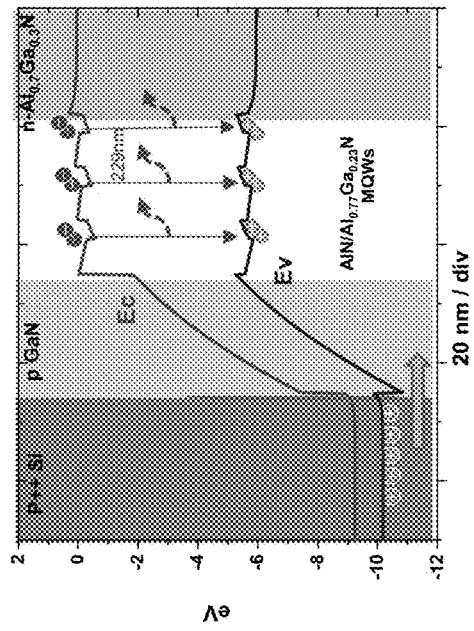
FIG. 14C is a band diagram of the entire LED structure consisting of p-Si, p-GaN, i-Al$_{0.77}$Ga$_{0.23}$N/AlN MQWs, and n-Al$_{0.7}$Ga$_{0.3}$N contact layer under forward bias of 10V with 300 A/cm$^2$.

Based on the analysis of the surface band bending and interface induced valance offset shift in the p-Si/$Al_2O_3$/p-GaN isotype heterojunction of Example 1, the whole LED structure was simulated using Silvaco®. The band alignment across the LED structure under a thermal equilibrium state and under a forward bias (10 V) at 300 A/$cm^2$ are shown in FIGS. 14B and 14C, respectively. As shown in FIG. 14C, the sharp band bending of the p-GaN was a combined effect of polarization and applied electric field with the forward bias, which facilitated holes tunneling across the Si/GaN heterojunction and transport into the quantum wells active region. As reflected in the carrier concentration distribution plot in FIG. 14D, a large quantity of holes from the reservoir of the p-type Si hole injection layer are injected into the $Al_{0.77}Ga_{0.23}N$ MQW active region after tunneling through the thin oxide current tunneling layer and drifting across the fully depleted p-type GaN contact layer. As a result of the sufficient hole supply from the Si NM, the concentration of electrons and holes was much better balanced within the quantum wells, which is essential to an effective recombination rate and quantum efficiency. From direct radiative recombination of holes and electrons within the MQWs, 229 nm photons were generated, which corresponds to the emission from the 3 nm $Al_{0.77}Ga_{0.23}N$ QW energy states.

Following the epitaxial growth of the III-V semiconductor heterostructures, fabrication of the LED continued by cleaning the epitaxial heterostructure. This was followed by the $Al_2O_3$ layer deposition. The p-type Si NM was then transferred onto the $Al_2O_3$, followed by a rapid thermal anneal (RTA) at 500° C. for 5 min to increase the bonding strength between the p-type Si NM and the $Al_2O_3$. A mesa photoresist pattern was formed by photolithography image reversal, followed by a reactive ion etching (RIE) process to etch away Si, and then etching the p-GaN/AlN/$Al_{0.77}Ga_{0.23}N$/AlN MQW using an inductively coupled plasma (ICP) etcher. Afterwards, a metal stack (Ti/Al/Ni/Au: 15/100/50/250 nm) was deposited onto the exposed n-type $Al_{0.7}Ga_{0.3}N$ layer using optical photolithography patterning, e-beam evaporation, and liftoff processes. A thermal anneal at 950° C. for 30 s for the cathode contact was then performed. Afterwards, the anode metal (Ti/Au: 15/100 nm) was deposited using the process that was used to form the cathode metal. Each device was isolated by etching away the Si NM and the underlying stack down to the homoepitaxial AlN layer. For optical characterization, the AlN substrate of the devices was thinned down to 80-100 μm. The cathode and anode metal contacts were designed to be in inter-digital form to minimize the lateral current spreading-induced resistance in the n-type $Al_{0.7}Ga_{0.3}N$ contact layer. In contrast, the sheet resistance of the 100-nm p-type Si NM with $5 \times 10^{19}$ $cm^{-3}$ doping concentration was negligible. Since the current passing through the MQW was primarily in the region beneath the anode, the effective device area was calculated from the anode metal area and was estimated to be $1.31 \times 10^{-3}$ $cm^2$.

In order to realize substantial light output from LEDs, epitaxial layers with low threading dislocation densities and an atomically flat surface are highly desirable. To address these challenges, bulk AlN substrates were used in this example to grow Al-face high Al composition AlGaN epitaxial heterostructures, reducing the dislocation density by several orders of magnitude compared with layers on non-native substrates, as the epitaxial device layers inherited the low dislocation density (<$10^4$ $cm^{-3}$) of the single-crystalline bulk AlN. Reducing the surface roughness of the epitaxial layers was especially desirable in this example, which entails a foreign membrane transfer step during fabrication. Surface roughness above ~2 nm leads to non-uniform bonding between the Si NM and GaN, which hinders carrier transport across the Si/GaN interface often results in leakage paths and reduced efficiency of the devices.

Given the role of surface roughness, the surface of the as-grown epitaxy samples and the epitaxy samples with the $Al_2O_3$ layer and the p-type Si NM were characterized using both an optical microscope and a Bruker Catalyst atomic force microscope (AFM). The extracted AFM root-mean-square (RMS) surface roughness results were taken from a $2 \times 2$ $m^2$ scan area. An average RMS roughness of 0.547 nm was measured and the images showed a crack-free surface.

The smooth surface allowed the high-yield (100%) transfer of the Si NM to the epitaxy surface and also enabled intimate contact between the Si NM hole injection layer and the top GaN p-type layer.

A filtered optical microscope image of a transferred p-Si NM on $Al_2O_3$ deposited epitaxial sample showed no wrinkles or defects were induced during the p-Si NM transfer. Based on an AFM image of the surface of the transferred p-Si NM with a 135×135 µm$^2$ surface scan area, an average 0.677 nm RMS surface roughness was extracted from a 2×2 µm$^2$ scan. For reference, the RMS value of p-Si NM (before transfer) was measured as 0.121 nm with a 2×2 µm$^2$ AFM surface scan after NM was released from a silicon-on-insulator (SOI). It was found that the surface roughness of Si NM after transfer roughly followed that of the original roughness of the epitaxy sample surface. The $Al_2O_3$ layer and Si NM were both rather thin and conformal and, therefore, inherited the surface roughness of the underlying epitaxial film.

Figure 15B:
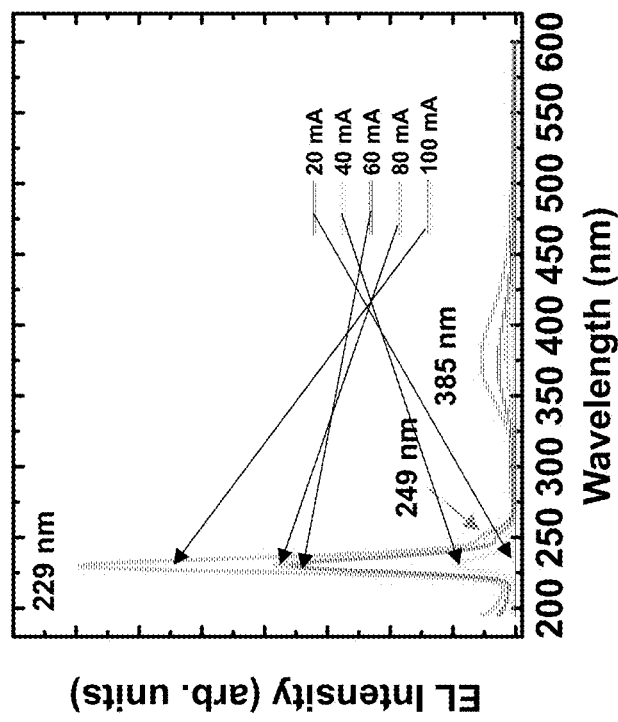
FIG. 15B shows EL spectra under different driving current densities with CW operation.
Figure 15A:
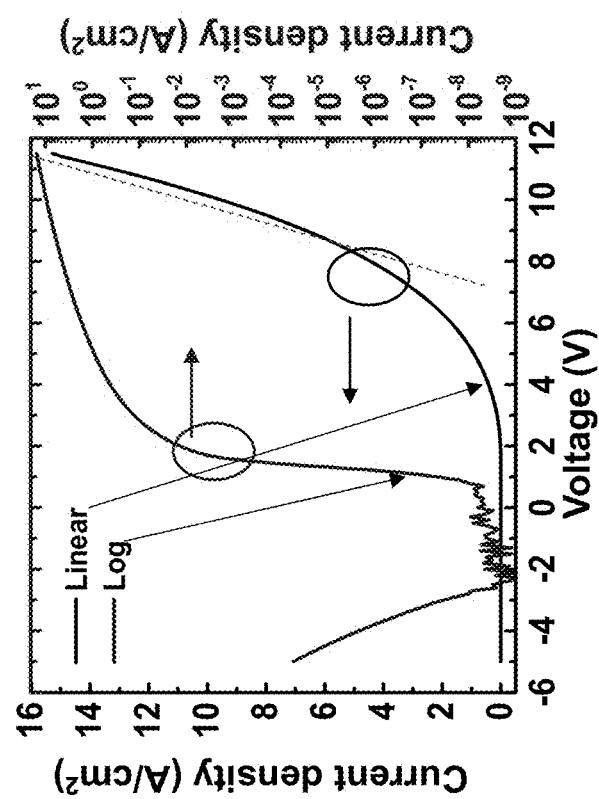
FIG. 15A shows the current density-voltage characteristics of a typical LED in linear and log scale.

To evaluate the electrical performance of the LEDs, current density as a function of applied voltage was measured. The measurement results are shown in FIG. 15A. It is seen from the linear scale plot that the LED has a typical rectifying characteristic and a turn-on voltage of about 7 V. In addition to the effective voltage drop across the MQW active region for carrier injection, the Si NM/$Al_2O_3$/p-GaN heterojunction, non-ideal n-contact and lateral current spreading resistance in the n-AlGaN layer are responsible for part of the turn-on voltage. Additionally, as seen in the log scale plot the reverse current is orders of magnitude lower than the forward current, which indicates that no significant leakage path, either through surface recombination or defects at the interface between Si and GaN, was formed. Electroluminescence (EL) spectra and optical power measurements were performed by coupling LED emission into a 6-inch diameter integrating sphere of a Gooch and Housego OL 770-LED calibrated spectroradiometer. The LED chip did not have any light extraction enhancements during EL measurements. Electrical power was supplied in constant current mode and temperature was not controlled, so the LEDs were allowed to self-heat. The linear scale of the measured EL spectra for drive current varied from 20 mA to 100 mA, as shown in FIG. 15B. The 229 nm peak radiating from the MQWs was dominant, with current ranging from 20 mA through 100 mA, and the peak intensity increasing correspondingly. To better illustrate the parasitic emission intensity in reference to the target peak, the logarithmic scale EL spectra under currents of 40, 60, 80 and 100 mA are plotted in FIG. 15D. It is seen that the intensities of the two parasitic peaks at 249 nm and 380 nm were both more than one order of magnitude lower than the main peak at 229 nm.

In addition to the main peak emission, there were two discernible weaker features at 249 nm and 385 nm in the UV and blue range, respectively. The former one is from the n-$Al_{0.7}Ga_{0.3}N$ layer with 4.98 eV gap energy, which corresponds to the emitted photon wavelength of 249 nm. Since the band gap of the electron injection layer n-$Al_{0.7}Ga_{0.3}N$ was smaller than the photon energy generated by the MQWs consisting of $Al_{0.77}Ga_{0.23}N$/AlN, light emission at 229 nm was partially reabsorbed and led to the secondary emission at 249 nm. The broad peak at 385 nm in the visible range resulted from multiple contributions, including from the top p-GaN combined and with deep-levels in AlGaN, excited by 229 nm photons.

Figures 15C, 15D:
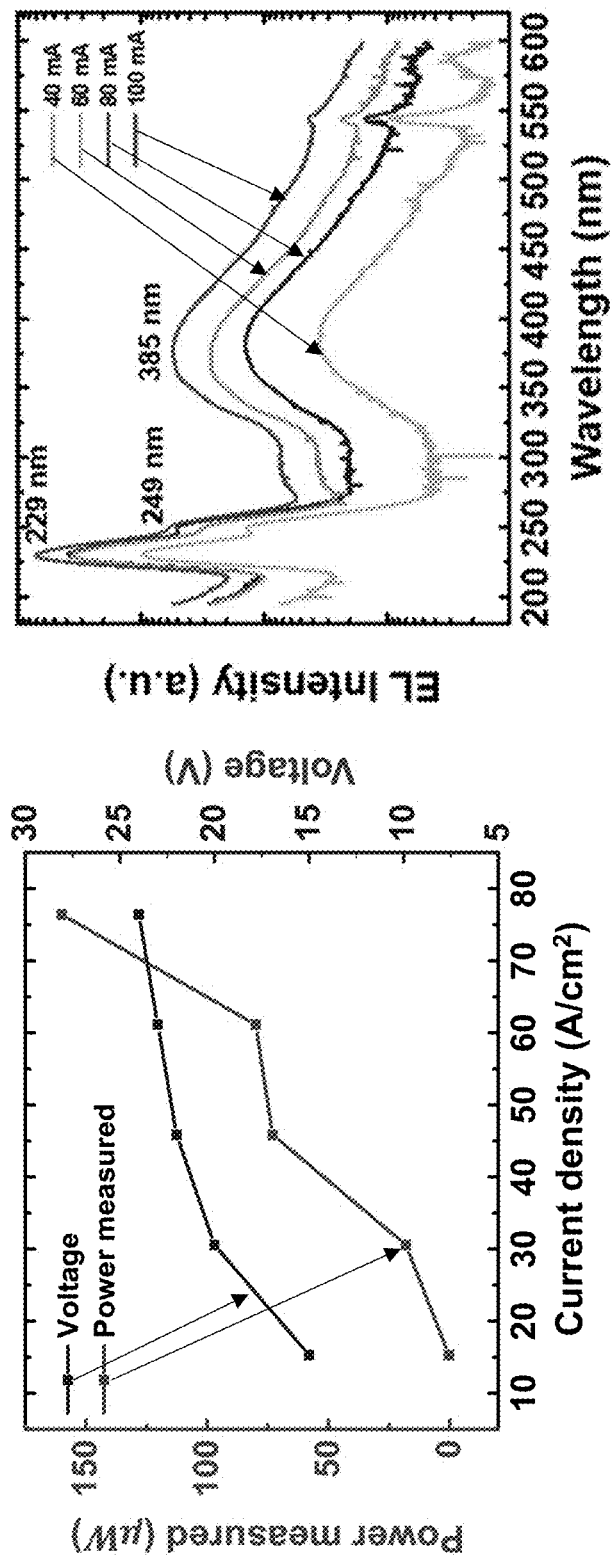
FIG. 15C is a plot of measured light output power as a function of input current density and that of the associated voltages as a function of the driving current density.
FIG. 15D is a logarithmic scale plot of EL spectra under currents of 40, 60, 80 and 100 mA.

Optical output power was measured and, as seen in FIG. 15C, the output continuously increased with current density up to 76 A/cm$^2$, equivalent to 100 mA and eventually reached an output power intensity of 160 µW at 24 V bias. The non-linearity of the power curve may be due to the lack of thermal management of the LED. A higher light output power is expected when light extraction patterning is used, and when losses to n-AlGaN are reduced. The corresponding external quantum efficiency (EQE) was calculated to be 0.03%, which could be improved by further thinning down the AlN substrate, which induces substantial absorption around 229 nm wavelength range due to point defects in the substrate.

Methods

The EL measurement system is a Gooch & Housego OL 770-LED spectroradiometer.

LED samples were mounted on the collection window of the sphere with the surface (Si side) facing upwards, and electrical connection applied by standard probes. The EL light emits directly into the integrating sphere from the bottom of the sample through the AlN substrate, which is then connected by optical fiber to a calibrated spectrometer to determine the optical output power. The only light transmitted in the downward direction could be effectively collected by the sphere and contributed to the total output light power. Thus, the related EQE value was also affected by the light extraction efficiency, which could be increased by a reflective top layer and further thinning down or surface roughening of the AlN substrate.

The EQE was calculated using the optical output power of 160 µW and current injection level of 76 A/cm$^2$, which was equivalent to 100 mA in total. The effective device area was calculated from the anode metal area and was estimated to be 1.31×10$^{-3}$ cm$^2$, since the current passing through the MQW was primarily in the region beneath the anode. The equation for EQE calculation is the ratio between the number of emitted photons and electrically injected carriers, as expressed in the following:

$$EQE = \frac{\text{photons out}}{\text{electrons in}} = \frac{P/\text{photon energy}}{I/e}$$

where P is optical output power (160 µW), photon energy is 5.414 eV (8.67e-19 J), I is total current (100 mA), and e is the elementary electron charge (1.60217662×10$^{-19}$ C). Following the equation, the corresponding external quantum efficiency is calculated as 0.0296%, which is rounded up to 0.03%.

Control Study

In order to do a comprehensive comparative study of the contrast between the LED structures without the $Al_2O_3$ and p-Si NM, particularly in terms of hole injection, and furthermore the light emission performances, simulations were carried out for the two structures. For the control structure, in consideration of the p-GaN metal contact and lateral current spreading in practice, the p-GaN thickness is commonly chosen to be relatively thick. In this example, 50 nm thickness was chosen. Band alignments under equilibrium and with a current injection of 100 A/cm$^2$ for the LEDs with and without the $Al_2O_3$/Si NM were calculated. Additionally, the carrier concentrations (electron and hole) in each structure, and a direct comparison for holes within the MQW region were calculated. Additionally, the corresponding radiative recombination rates within each quantum well were calculated. It was observed that the hole concentration within the quantum wells (especially the first two wells) was higher than the control structure without the p-Si NM hole injection layer. This was further confirmed by an enhanced radiative recombination rate, resulting from the more balanced electron-hole density within QWs.

Si NM Bonding Process

The bonding and annealing process of the Si NM and the LED substrate was conducted as follows. The LED epitaxial samples were cleaned by the standard RCA method, which involved sonication of the samples in acetone, isopropyl alcohol (IPA), and deionized (DI) water for 10 min to remove particles and dust from the surface, followed by immersion in piranha solution (a mixture of $H_2SO_4:H_2O_2$ (4:1)) to remove metals and organic contaminants. The samples were then immersed in SC-1 solution ($H_2O:H_2O_2$:$NH_4OH$ (5:1:1)) and SC-2 solution ($H_2O:H_2O_2$:HCl (5:1:1)) for 10 minutes per solution at room temperature to remove any remaining organic contaminants, heavy metals, and ionic contaminants. Finally, the native oxide on the wafer surface (p-GaN) was removed using diluted hydrogen fluoride (HF) (1:50 of HF:DI water) followed by a thorough rinse in deionized (DI) water before drying with a nitrogen gun.

A 0.5 nm thick $Al_2O_3$ current tunneling layer was deposited by an Ultratech/Cambridge Nanotech Savannah S200 ALD system, which was integrated with a nitrogen filled glove box. The sample was loaded into the chamber after removing native oxide with HF. All the processes after removal of the native oxide layer were carried out in a nitrogen environment. The chamber was pre-heated to 200° C. and was pumped down to vacuum (<0.1 mTorr) immediately after loading the sample. During the ALD process, trimethylaluminum (TMA) gas and water vapor were purged for 0.015 s every 5 s. Five cycles of the ALD process were performed to achieve the targeted 0.5 nm thick $Al_2O_3$ layer.

The p-type single-crystal Si NM hole injection layer was then released from a silicon-on-insulator (SOI) substrate and print-transferred to the $Al_2O_3$ structure. A thermal anneal procedure was performed at 500° C. for 5 min to form chemical bonding between the p-type Si NM and $Al_2O_3$.

Thermal Anneal Effects on Si NM

The appearance of Si NM bonded on the epi layer was not affected by the thermal anneal. In order to investigate the crystalline quality of the Si NM before and after RTA ohmic annealing at 950° C. for 30 sec in $N_2$ ambient, a Horiba LabRAM ARAMIS Raman confocal microscope was adapted with a 50× objective with an He—Ne (541.5 nm) laser. In the Raman spectra of the transferred Si NM on AlN wafer, sharp Si Raman peaks were measured to be 260.38 and 244.6 counts at 520.28 $cm^{-1}$, before and after annealing, respectively. The Raman spectrum within the full scan also showed clear AlGaN peaks at 662.82 and 896.14 $cm^{-1}$. These Raman peaks before and after RTA annealing confirm that the Si NM and AlGaN substrates are free from annealing-induced strain and degradation.

Example 6

In this example, DUV LEDs based on AlN/$Al_{0.81}Ga_{0.19}N$ quantum well (QW) epitaxial heterostructures grown on bulk AlN substrates were demonstrated at a wavelength of 226 nm employing p-type Si as a hole injection layer, p-contact, and reflective layer. A heavily p-doped crystalline Si nano-membrane (Si NM) was transferred on the planar epi-grown structure after a 0.5 nm $Al_2O_3$ atomic layer deposition as a current tunneling layer. The hole transport mechanism for the Si NM/$Al_2O_3$/p-GaN p-type contact was illustrated with band alignments and characterized electrically by both simulation and experiments. Furthermore, the impact of the Si NM on top of the UV LED on light extraction, in reference to a conventional p-GaN, was examined. Lastly, device performances were characterized by electroluminescence (EL) measurements, including current density-voltage characteristics and EL spectrum intensity as a function of current density. 230 pW output power under 15 A/$cm^2$ current density was observed with a peak at 226 nm, which is predominant over the EL spectrum without an obvious second emission peak.

Figure 16:
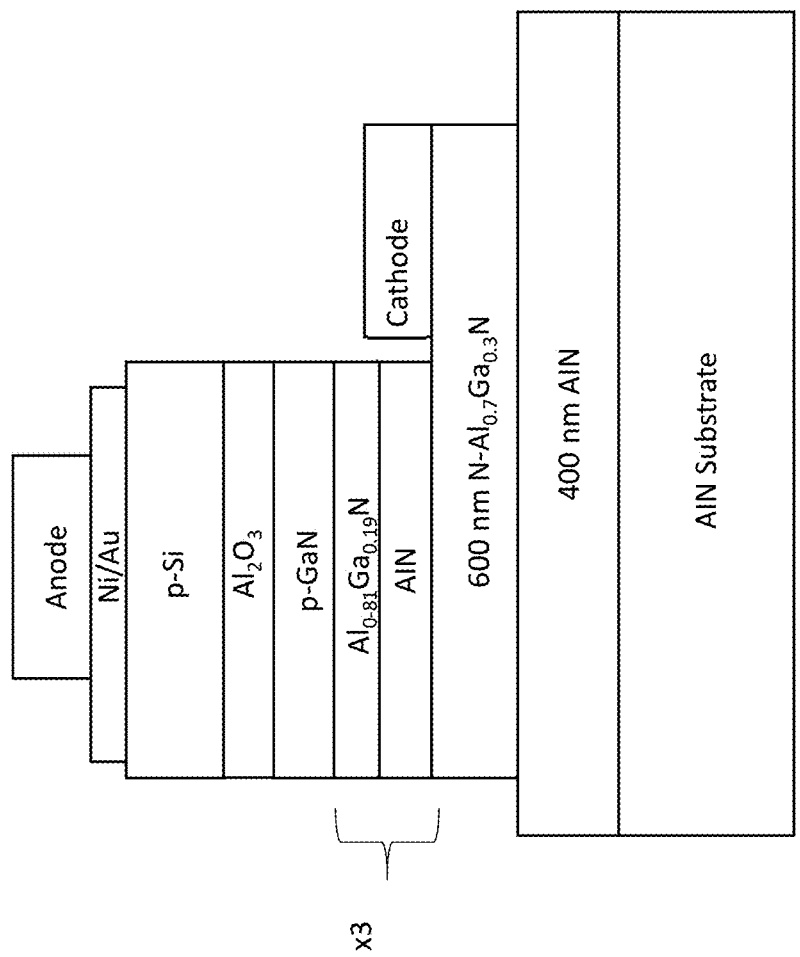
FIG. 16 is a schematic cross-sectional view of a UV LED structure.

The UV LED structure in FIG. 16 was grown on an AlN substrate by low pressure organometallic vapor phase epitaxy (LP-OMVPE) in a custom high-temperature reactor. Following the growth of an initial 400 nm AlN homoepitaxial layer on an AlN substrate, an Si-doped 600 nm n-$Al_{0.7}Ga_{0.3}N$ contact and electron injection layer was grown prior to the growth of a 3-period 3 nm $Al_{0.81}Ga_{0.2}N$/6 nm AlN MQWs active region. The epitaxy growth was terminated with a 5 nm Mg doped p-GaN layer to circumvent rapid oxidation of the AlN surface. Prior to the transferring of a 100 nm thick heavily doped p+Si single-crystal nanomembrane (NM) with a doping concentration of $5×10^9$ $cm^{-3}$, around 0.5 nm of $Al_2O_3$ was deposited by five cycles of the ALD process using Ultratech/Cambridge Nanotech Savannah S200 ALD system, followed by a rapid thermal anneal (RTA) at 500° C. for 5 minutes to increase the bonding strength between the p-Si NM and $Al_2O_3$. An n-mesa was formed by photolithography image reversal, followed by the RIE Si etching process and by the ICP etcher for GaN/AlN/AlGaN. Then, a stack of cathode metals (Ti/Al/Ni/Au, 15/100/50/250 nm) was deposited and annealed at 950° C. for 30 s for the cathode Ohmic contact. Another stack of anode metals (Ti/Au, 15/10 nm) was deposited, and each device was isolated by etching further down to the AlN layer.

Figures 17D, 17E:
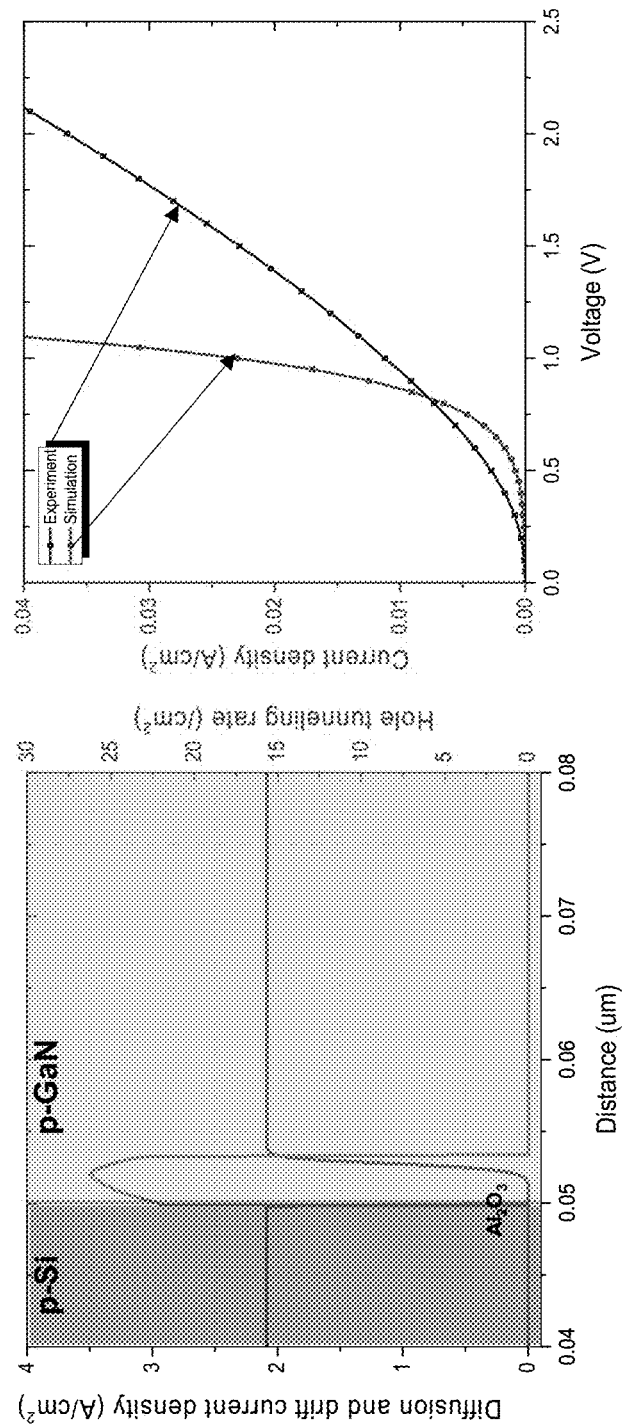

The multilayered p-contact consisting of p-Si/$Al_2O_3$/p-GaN was investigated with regard to its band alignment and resultant electrical characteristics. As shown in FIG. 17A, the test structure was made of 100 nm p-Si (carrier concentration of $5×10^9$ $cm^{-3}$), 0.5 nm $Al_2O_3$, and 200 nm p-GaN (carrier concentration of $1×10^{18}$ $cm^{-3}$). The anode metal was applied on the p-Si and the cathode contact was on the p-GaN at the time of electrical measurements. The valance band offset is 1.092 eV between the p-Si and p-Ga. The Silvaco tool was used for electrical simulation, and the simulated band alignment, including the 0.5 nm $Al_2O_3$ current tunneling layer under thermal equilibrium and 2 V, are plotted in FIGS. 17B and 17C, respectively. There existed a ~4 nm triangle-shaped barrier formed in the valence band by the $Al_2O_3$ interfacial layer and the valence band offset between Si and GaN. As the forward bias increased, the barrier became narrower, increasing the tunneling rate. FIG. 17D illustrates the contribution of the hole tunneling current to the total current, the majority of which was comprised of diffusion and drift current outside the energy barrier region. The tunneling-contributed current was predominant across the $Al_2O_3$ interfacial layer, and the valence band barrier formed in the p-GaN as a result of the valence band offset. The corresponding simulated and measured current-voltage curves in linear scale are shown in FIG. 17E, which shows nearly Ohmic behavior with a turn-on voltage of 0.7 V.

The impact of Si NM on light extraction efficiency in reference to the commonly used thick p-GaN contact layer was analyzed from an optical perspective. Si is highly absorptive in the UV range, whereas in this design, due to the extremely short penetration depth, light was mostly reflected rather than absorbed with light incident. The complex optical index n+ik of Si and AlGaN over the range of 200 nm to 400 nm was fitted based on ellipsometer measurements. The n, k values of GaN were then extracted using theoretical dispersion analysis. Thus, due to the large n, k difference between the Si NM and GaN (AlGaN), the reflectance from the top Si NM was substantial. For example, at 226 nm the reflectance R at normal incidence at the interface between Si ($\underline{n}_{si}$=1.43+3.37i) and GaN ($n_{GaN}$=2.78+0.65i) is 24%, whereas the reflectance is only 1% between GaN and AlGaN ($n_{AlGaN}$=2.40+0.3i) for the common UV LED structure with a top p-GaN contact layer.

Figure 18:
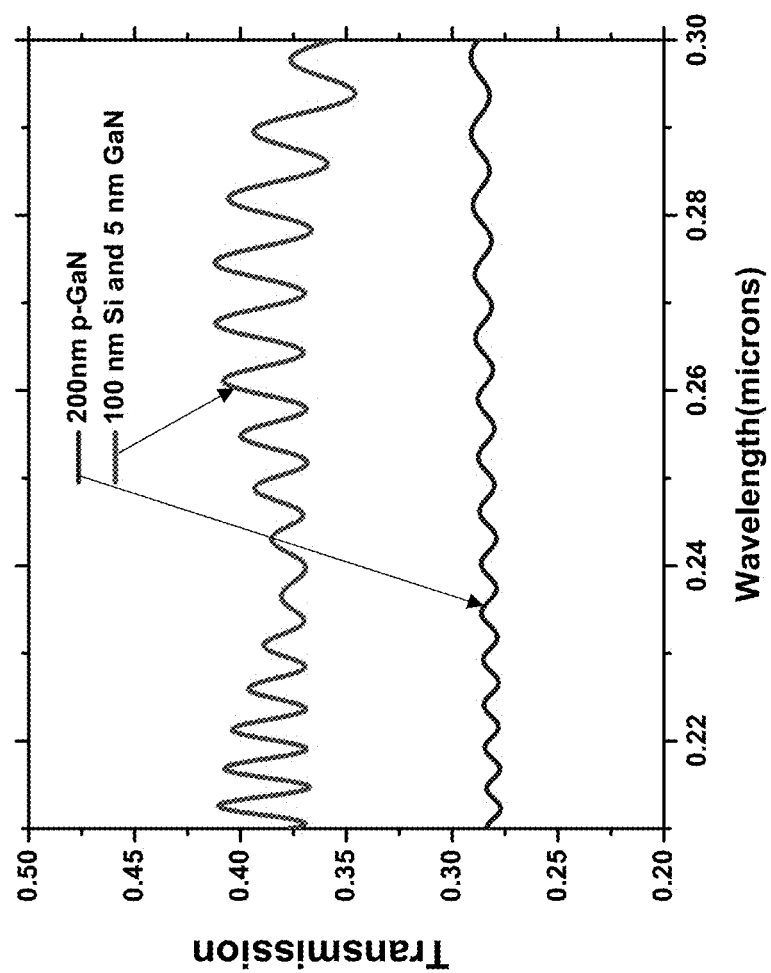
FIG. 18 depicts an optical simulation for light extraction efficiency (LEE) for the structures: case #1, LED structure of conventional UV LEDs with 200 nm p-GaN on top as the contact layer; and case #2, the design of this disclosure.

To comprehensively evaluate the LEE enhancement by Si, reflectance to both TE and TM emitted light from QWs were taken into account. FDTD was used to simulate the light propagation path with light emitted from TE and TM dipoles within the QW region. The light transmission path from the dipole source to air clearly shows that the Si NM enhanced the light reflection when the light propagated toward the Si/AlN interface, in contrast to the GaN/AlN for both the TE and TM modes. FIG. 18 gives quantitative comparisons for the two structures in terms of total light emission from the bottom sides, since the light transmitted in the upward direction is negligible, as it is either reflected or absorbed by the p-Si or p-GaN. A 70% LEE improvement was obtained by p-Si compared to p-GaN. The transmission calculation in FIG. 18 was carried out under the assumption that the ratio of TE/TM emission from the QWs is 1.

The electrical performance of the LEDs, including current density-voltage and electroluminescence (EL), are shown in FIGS. 19A and 19B, respectively. It can be seen from the linear scale plot that the LED has rectifying characteristics and a turn-on voltage of about 11 V. On the other hand, the low reverse current revealed in the log scale indicates the absence of a significant leakage path, either through surface recombination or defects at the interface between Si and GaN. EL spectrum and optical power measurements were performed by coupling LED emission into a 6-inch diameter integrating sphere of a Gooch and Housego OL 770-LED calibrated spectroradiometer. Electrical power was supplied in constant current mode, and the temperature was not controlled. The measured EL spectra under a constant drive current of 20 mA is shown in FIG. 19B. The 226 nm peak radiating from the MQWs is dominant, with one discernible weaker feature at around 245 nm, which is speculated to be emitted from the n-$Al_{0.7}Ga_{0.3}N$ layer. The optical output power was measured, and 220 µW power intensity was observed with equivalent current density of 15 A/cm². The corresponding external quantum efficiency (EQE) was calculated to be 0.2% and can be improved by further thinning down the AlN substrate, which induces substantial absorption due to point defects in the substrate and light extraction patterning.

In this example UV LEDs at 226 nm light emission based on A/N/$Al_{0.81}Ga_{0.19}N$ epitaxial QWs heterostructures on bulk AlN substrates, with adoption of p-Si as both the holes injector and optical reflection layer, have been demonstrated. Focusing on the two most prominent issues, inefficient hole injection and poor light extraction due to absorption, the output optical power and corresponding EQE were measured at 220 µW and 0.2%, respectively, under continuous current and room temperature operation. Thus, a practical route for efficient UV LEDs with shorter wavelengths is provided.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A light-emitting device comprising:
    a p-type contact comprising:
        a hole injection layer comprising a single-crystalline or polycrystalline p-type doped semiconductor material;
        a p-type layer comprising p-type doped group III-nitride; and
        a current tunneling layer disposed between the hole injection layer and the p-type group III-nitride layer, the current tunneling layer comprising an inorganic material having a bandgap that is wider than the bandgaps of the p-type doped semiconductor material and the p-type doped group III-nitride, wherein the interface between the current tunneling layer and the hole injection layer and the interface between the current tunneling layer and the p-type layer do not have an epitaxial structure;
    an n-type contact; and
    an active region comprising intrinsic semiconductor materials disposed between the p-type contact and the n-type contact, the active region comprising a multiple quantum well structure comprising alternating group III-V nitride barrier layers and group III-V nitride quantum well layers.

2. The device of claim 1, wherein the inorganic material is an oxide that is not a native oxide of the p-type doped semiconductor material or a native oxide of the p-type group III-nitride.

3. The device of claim 2, wherein the inorganic material is aluminum oxide.

4. The device of claim 1, wherein the p-type doped group III-nitride is p-type GaN.

5. The device of claim 4, wherein the p-type doped semiconductor material comprises a p-type doped group IV semiconductor.

6. The device of claim 1, wherein the p-type doped semiconductor material comprises a p-type doped group IV semiconductor.

7. The device of claim 6, wherein the p-type doped group IV semiconductor is p-type doped silicon.

8. The device of claim 7, wherein the p-type doped silicon is single-crystalline silicon.

9. The device of claim 7, wherein the p-type doped silicon is polycrystalline silicon.

10. The device of claim 7, wherein the group III-V nitride barrier layers comprise AlN and the group III-V nitride quantum well layers comprise AlGaN.

11. The device of claim 10, wherein the AlGaN is $Al_xGa_{1-x}N$, wherein x is at least 0.8.

12. The device of claim 11, wherein the current tunneling layer is a layer of aluminum oxide.

13. The device of claim 12, wherein the device is capable of emitting light having wavelengths of less than 250 nm.

14. The device of claim 7, wherein the group III-V nitride barrier layers comprise GaN and the group III-V nitride quantum well layers comprise InGaN.

15. The device of claim 14, wherein the current tunneling layer is a layer of aluminum oxide.

16. The device of claim 15, wherein the device is capable of emitting light within the wavelength range from 430 nm to 470 nm.

17. The device of claim 6, wherein the p-type doped group IV semiconductor is p-type germanium.

18. The device of claim 17, wherein the current tunneling layer is a layer of aluminum oxide.

19. The device of claim 1, wherein the group III-V nitride barrier layers comprise AlN and the group III-V nitride quantum well layers comprise AlGaN.

20. The device of claim 19, wherein the AlGaN is $Al_xGa_{1-x}N$, wherein x is at least 0.5.

21. The device of claim 1, wherein the current tunneling layer is a layer of $HfO_2$.

22. The device of claim 1, wherein the p-type layer comprising p-type doped GaN has a thickness no greater than 50 nm.

* * * * *

UNITED STATES PATENT AND TRADEMARK OFFICE
CERTIFICATE OF CORRECTION

Page 1 of 2

PATENT NO. : 10,347,790 B2
APPLICATION NO. : 15/928774
DATED : July 9, 2019
INVENTOR(S) : Zhenqiang Ma et al.

It is certified that error appears in the above-identified patent and that said Letters Patent is hereby corrected as shown below:

In the Specification

Column 3, Line 21:
Delete the phrase "$1.31 \times 10^{'3}$ cm$^2$." and replace with --$1.31 \times 10^{-3}$ cm$^2$.--.

Column 12, Line 3:
Delete the phrase "265 pW" and replace with --265 µW--.

Column 14, Line 53:
Delete the phrase "values of 0.0750 and 0.1°" and replace with --values of 0.075° and 0.1°--.

Column 15, Line 19:
Delete the phrase "Al$_{0.72}$Ga$_{0.28}$N/AN MQWs" and replace with --Al$_{0.72}$Ga$_{0.28}$N/AlN MQWs--.

Column 18, Lines 45-46:
Delete the phrase "$\varDelta E_V = [E_{CL}{}^{GaN} - E_V{}^{GaN}]_b - [E_{CL}{}^{Al_2O_3} - E_V{}^{Al_2O_3}]_b - [E_{CL}{}^{GaN} - E_V{}^{Al_2O_3}]_i$" and replace with --$\varDelta E_V = [E_{CL}^{GaN} - E_V^{GaN}]_b - [E_{CL}^{Al_2O_3} - E_V^{Al_2O_3}]_b - [E_{CL}^{GaN} - E_V^{Al_2O_3}]_i$--.

Column 21, Line 30:
Delete the phrase "where the $v_B$ e s the frequency of light" and replace with --where the $v_B$ is the frequency of light--.

Column 24, Line 62:
Delete the phrase "levels of Si 2p, Ga 3d, Hf 4f, N Is, O Is, and C is" and replace with --levels of Si 2p, Ga 3d, Hf 4f, N 1s, O 1s, and C 1s--.

Signed and Sealed this
Twenty-second Day of October, 2019

Andrei Iancu
*Director of the United States Patent and Trademark Office*

CERTIFICATE OF CORRECTION (continued)
U.S. Pat. No. 10,347,790 B2

Column 30, Line 6:
Delete the phrase "230 ρW" and replace with --230 $\mu$W--.

Column 30, Lines 38-39:
Delete the phrase "p-Si (carrier concentration of $5\times10^9$ cm$^{-3}$)," and replace with --p-Si (carrier concentration of $5\times10^{19}$ cm$^{-3}$),--.

Column 31, Line 10:
Delete the phrase "AlGaN ($n_{AlGaN}$=2.40+0.3i)" and replace with --AlGaN ($n_{AlGaN}$=2.40+0.31i)--.

Column 31, Line 54:
Delete the phrase "A/N/ $Al_{0.81}Ga_{0.19}N$" and replace with --AlN/ $Al_{0.81}Ga_{0.19}N$--.